(12) United States Patent
Yasukawa et al.

(10) Patent No.: US 7,947,992 B2
(45) Date of Patent: May 24, 2011

(54) LIGHT-EMITTING ELEMENT, DISPLAY DEVICE, AND ELECTRONIC APPARATUS

(75) Inventors: Koji Yasukawa, Suwa (JP); Masayuki Mitsuya, Chino (JP)

(73) Assignee: Seiko Epson Corporation, Tokyo (JP)

( * ) Notice: Subject to any disclaimer, the term of this patent is extended or adjusted under 35 U.S.C. 154(b) by 206 days.

(21) Appl. No.: 12/356,697

(22) Filed: Jan. 21, 2009

(65) Prior Publication Data
US 2009/0261360 A1 Oct. 22, 2009

(30) Foreign Application Priority Data

Jan. 29, 2008 (JP) ................................. 2008-018400

(51) Int. Cl.
*H01L 29/20* (2006.01)
(52) U.S. Cl. .................... 257/89; 257/E33.012; 313/506
(58) Field of Classification Search .................... 257/89, 257/90, E33.012; 313/506
See application file for complete search history.

(56) References Cited

U.S. PATENT DOCUMENTS
2006/0227079 A1* 10/2006 Kashiwabara .................. 345/76

FOREIGN PATENT DOCUMENTS
JP A-2005-100921 4/2005
* cited by examiner

*Primary Examiner* — Mark Prenty
(74) *Attorney, Agent, or Firm* — Oliff & Berridge, PLC

(57) ABSTRACT

A light-emitting element includes a cathode, an anode, a first light-emitting layer disposed between the cathode and the anode, a second light-emitting layer disposed between the first light-emitting layer and the cathode, a third light-emitting layer disposed between the second light-emitting layer and the cathode, a first interlayer disposed between the first and second light-emitting layers that has a function of preventing energy transfer of an exciton between the first and second light-emitting layers, and a second interlayer disposed between the second and third light-emitting layers that has a function of preventing energy transfer of an exciton between the second and third light-emitting layers, wherein the first interlayer has a hole-transporting property higher than that of the second interlayer, and the second interlayer has a electron-transporting property higher than that of the first interlayer.

22 Claims, 7 Drawing Sheets

LIGHT-EMITTING ELEMENT, DISPLAY DEVICE, AND ELECTRONIC APPARATUS

BACKGROUND

1. Technical Field

The present invention relates to a light-emitting element, a display device, and an electronic apparatus.

2. Related Art

An organic electroluminescence element (organic EL element) is a light-emitting element having a structure in which at least one luminescent organic layer is interposed between an anode and a cathode. In such a light-emitting element, by applying an electric field between the cathode and the anode, an electron is injected into a light-emitting layer from the cathode side and a hole is injected into the light-emitting layer from the anode side. The electron and the hole are recombined in the light-emitting layer to generate an exciton. When the exciton returns to the ground state, a corresponding amount of energy is emitted as light.

A known example of such a light-emitting element is an element which includes three laminated light-emitting layers corresponding to three colors of red (R), green (G), and blue (B) and which emits white light (see, for example, JP-A-2005-100921). By using such a light-emitting element which emits white light in combination with a color filter in which three colors of red (R), green (G), and blue (B) are separately disposed in each pixel, full-color images can be displayed. In the light-emitting element disclosed in JP-A-2005-100921, by providing an interlayer between light-emitting layers, transfer of energy of an exciton between the light-emitting layers can be prevented. Consequently, light is emitted from each of the light-emitting layers with good balance, thus realizing white light emission. However, it is difficult for the light-emitting element disclosed in JP-A-2005-100921 to obtain white light with a high purity, and the durability of the light-emitting element is low.

SUMMARY

An advantage of some aspects of the invention is that it provides a light-emitting element which includes three or more laminated light-emitting layers, which has excellent durability and luminous efficiency, and in which the light-emitting layers emit light with good balance, and a display device and electronic apparatus including the light-emitting element and having high reliability.

A light-emitting element according to a first aspect of the invention includes a cathode, an anode, a first light-emitting layer that is disposed between the cathode and the anode and that emits light of a first color, a second light-emitting layer that is disposed between the first light-emitting layer and the cathode and that emits light of a second color different from the first color, a third light-emitting layer that is disposed between the second light-emitting layer and the cathode and that emits light of a third color different from the first color and the second color, a first interlayer that is disposed between the first light-emitting layer and the second light-emitting layer so as to be in contact with the first and second light-emitting layers and that has a function of preventing energy transfer of an exciton between the first light-emitting layer and the second light-emitting layer, and a second interlayer that is disposed between the second light-emitting layer and the third light-emitting layer so as to be in contact with the second and third light-emitting layers and that has a function of preventing energy transfer of an exciton between the second light-emitting layer and the third light-emitting layer, wherein the first interlayer has a hole-transporting property higher than that of the second interlayer, and the second interlayer has an electron-transporting property higher than that of the first interlayer. Accordingly, in a structure including laminated three or more light-emitting layers, light can be emitted from each of the light-emitting layers with good balance while realizing excellent durability and luminous efficiency.

The energy level of the highest occupied molecular orbital of a material constituting the first interlayer is preferably higher than the energy level of the highest occupied molecular orbital of a material constituting the first light-emitting layer. In this case, the first interlayer limits the amount of movement of holes from the first light-emitting layer to the second light-emitting layer, and thus light can be emitted from the first light-emitting layer and the second light-emitting layer with good balance.

The energy level of the highest occupied molecular orbital of the material constituting the first interlayer preferably lies between the energy level of the highest occupied molecular orbital of the material constituting the first light-emitting layer and the energy level of the highest occupied molecular orbital of a material constituting the second light-emitting layer. In this case, by reducing the energy gap between the highest occupied molecular orbital of the material constituting the first light-emitting layer and the highest occupied molecular orbital of the material constituting the second light-emitting layer (by reducing the height of a barrier due to the energy gap), the driving voltage of the light-emitting element can be reduced.

The difference between the energy level of the highest occupied molecular orbital of the material constituting the first interlayer and the energy level of the highest occupied molecular orbital of each of the materials constituting the first light-emitting layer and the second light-emitting layer is preferably in the range of 0.1 to 0.4 eV. In this case, the driving voltage of the light-emitting element can be reduced while achieving an excellent light-emission balance between the first light-emitting layer and the second light-emitting layer.

The energy level of the lowest unoccupied molecular orbital of a material constituting the first interlayer is preferably lower than the energy level of the lowest unoccupied molecular orbital of a material constituting the second light-emitting layer. In this case, the first interlayer limits the amount of movement of electrons from the second light-emitting layer to the first light-emitting layer, and thus light can be emitted from the first light-emitting layer and the second light-emitting layer with good balance.

The energy level of the lowest unoccupied molecular orbital of the material constituting the first interlayer preferably lies between the energy level of the lowest unoccupied molecular orbital of the material constituting the first light-emitting layer and the energy level of the lowest unoccupied molecular orbital of the material constituting the second light-emitting layer. In this case, by reducing the energy gap between the lowest unoccupied molecular orbital of the material constituting the first light-emitting layer and the lowest unoccupied molecular orbital of the material constituting the second light-emitting layer (by reducing the height of a barrier due to the energy gap), the driving voltage of the light-emitting element can be reduced.

The difference between the energy level of the lowest unoccupied molecular orbital of the material constituting the first interlayer and the energy level of the lowest unoccupied molecular orbital of each of the materials constituting the first light-emitting layer and the second light-emitting layer is preferably in the range of 0.1 to 0.4 eV. In this case, the driving voltage of the light-emitting element can be reduced while achieving an excellent light-emission balance between the first light-emitting layer and the second light-emitting layer.

The energy level of the highest occupied molecular orbital of a material constituting the second interlayer is preferably higher than the energy level of the highest occupied molecular orbital of a material constituting the second light-emitting layer. In this case, the second interlayer limits the amount of movement of holes from the second light-emitting layer to the third light-emitting layer, and thus light can be emitted from the second light-emitting layer and the third light-emitting layer with good balance.

The energy level of the highest occupied molecular orbital of the material constituting the second interlayer preferably lies between the energy level of the highest occupied molecular orbital of the material constituting the second light-emitting layer and the energy level of the highest occupied molecular orbital of a material constituting the third light-emitting layer. In this case, by reducing the energy gap between the highest occupied molecular orbital of the material constituting the second light-emitting layer and the highest occupied molecular orbital of the material constituting the third light-emitting layer (by reducing the height of a barrier due to the energy gap), the driving voltage of the light-emitting element can be reduced.

The difference between the energy level of the highest occupied molecular orbital of the material constituting the second interlayer and the energy level of the highest occupied molecular orbital of each of the materials constituting the second light-emitting layer and the third light-emitting layer is preferably in the range of 0.1 to 0.4 eV. In this case, the driving voltage of the light-emitting element can be reduced while achieving an excellent light-emission balance between the second light-emitting layer and the third light-emitting layer.

The energy level of the lowest unoccupied molecular orbital of a material constituting the second interlayer is preferably lower than the energy level of the lowest unoccupied molecular orbital of a material constituting the third light-emitting layer. In this case, the second interlayer limits the amount of movement of electrons from the third light-emitting layer to the second light-emitting layer, and thus light can be emitted from the second light-emitting layer and the third light-emitting layer with good balance.

The energy level of the lowest unoccupied molecular orbital of the material constituting the second interlayer preferably lies between the energy level of the lowest unoccupied molecular orbital of the material constituting the second light-emitting layer and the energy level of the lowest unoccupied molecular orbital of the material constituting the third light-emitting layer. In this case, by reducing the energy gap between the lowest unoccupied molecular orbital of the material constituting the second light-emitting layer and the lowest unoccupied molecular orbital of the material constituting the third light-emitting layer (by reducing the height of a barrier due to the energy gap), the driving voltage of the light-emitting element can be reduced.

The difference between the energy level of the lowest unoccupied molecular orbital of the material constituting the second interlayer and the energy level of the lowest unoccupied molecular orbital of each of the materials constituting the second light-emitting layer and the third light-emitting layer is preferably in the range of 0.1 to 0.4 eV. In this case, the driving voltage of the light-emitting element can be reduced while achieving an excellent light-emission balance between the second light-emitting layer and the third light-emitting layer.

The first interlayer preferably contains an amine hole transport material. Amine hole transport materials have a good hole-transporting property. Therefore, by using such a hole transport material as the material of the first interlayer, transfer of a hole from the first light-emitting layer to the second light-emitting layer through the first interlayer can be performed very smoothly.

The second interlayer preferably contains a silole electron transport material. Silole electron transport materials have a good electron-transporting property. Therefore, by using such an electron transport material as the material of the second interlayer, transfer of an electron from the third light-emitting layer to the second light-emitting layer through the second interlayer can be performed very smoothly.

At least one of the first interlayer and the second interlayer preferably contains an acene bipolar material. Acene bipolar materials have good carrier-transporting properties (hole-transporting property and electron-transporting property) and carrier resistance. Therefore, when such a bipolar material is used as the material constituting the first interlayer, transfer of a hole from the first light-emitting layer to the second light-emitting layer through the first interlayer and transfer of an electron from the second light-emitting layer to the first light-emitting layer through the first interlayer can be performed very smoothly while realizing good carrier resistance of the first interlayer. When such a bipolar material is used as the material constituting the second interlayer, transfer of a hole from the second light-emitting layer to the third light-emitting layer through the second interlayer and transfer of an electron from the third light-emitting layer to the second light-emitting layer through the second interlayer can be performed very smoothly while realizing good carrier resistance of the second interlayer.

The first interlayer preferably includes a first layer disposed so as to be in contact with the first light-emitting layer and containing an amine hole transport material as a main material and a second layer disposed so as to be in contact with the second light-emitting layer and containing an acene bipolar material as a main material. In this case, the first light-emitting layer and the second light-emitting layer can emit light with good balance while realizing excellent durability and luminous efficiency.

The second interlayer preferably includes a first layer disposed so as to be in contact with the second light-emitting layer and containing an acene bipolar material as a main material and a second layer disposed so as to be in contact with the third light-emitting layer and containing a silole electron transport material as a main material. In this case, the second light-emitting layer and the third light-emitting layer can emit light with good balance while realizing excellent durability and luminous efficiency.

Preferably, the first light-emitting layer is a red-light-emitting layer that emits red light as the first color, the second light-emitting layer is a blue-light-emitting layer that emits blue light as the second color, and the third light-emitting layer is a green-light-emitting layer that emits green light as the third color. In this case, white light can be emitted. Alternatively, the first light-emitting layer may be a green-light-emitting layer that emits green light as the first color, the second light-emitting layer may be a red-light-emitting layer that emits red light as the second color, and the third light-emitting layer may be a blue-light-emitting layer that emits blue light as the third color. In this case, white light can be emitted.

Each of the first interlayer and the second interlayer preferably has an average thickness of 100 nm or less. In this case, light can be emitted from each of the light-emitting layers with good balance while reducing the driving voltage of the light-emitting element.

A display device according to a second aspect of the invention includes the light-emitting element according to the first aspect of the invention. Accordingly, a display device having excellent reliability can be provided. An electronic apparatus according to a third aspect of the invention includes the display device according to the second aspect of the invention. Accordingly, an electronic apparatus having excellent reliability can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Preferred embodiments of a light-emitting element, a display device, and an electronic apparatus of the invention will now be described with reference to the attached drawings.

First Embodiment

Figure 1:
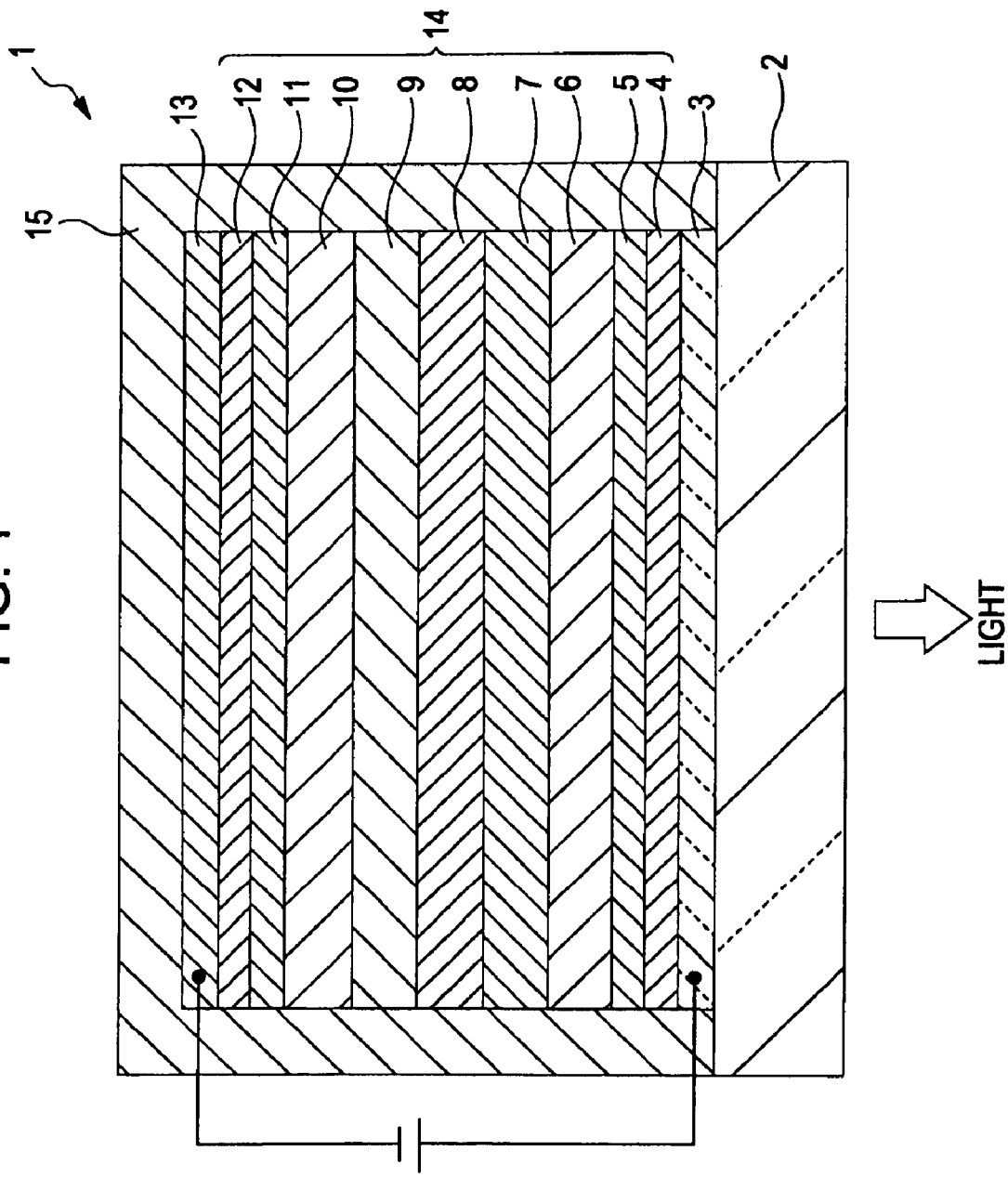
FIG. 1 is a schematic longitudinal cross-sectional view of a light-emitting element according to a first embodiment of the invention.
Figure 2:
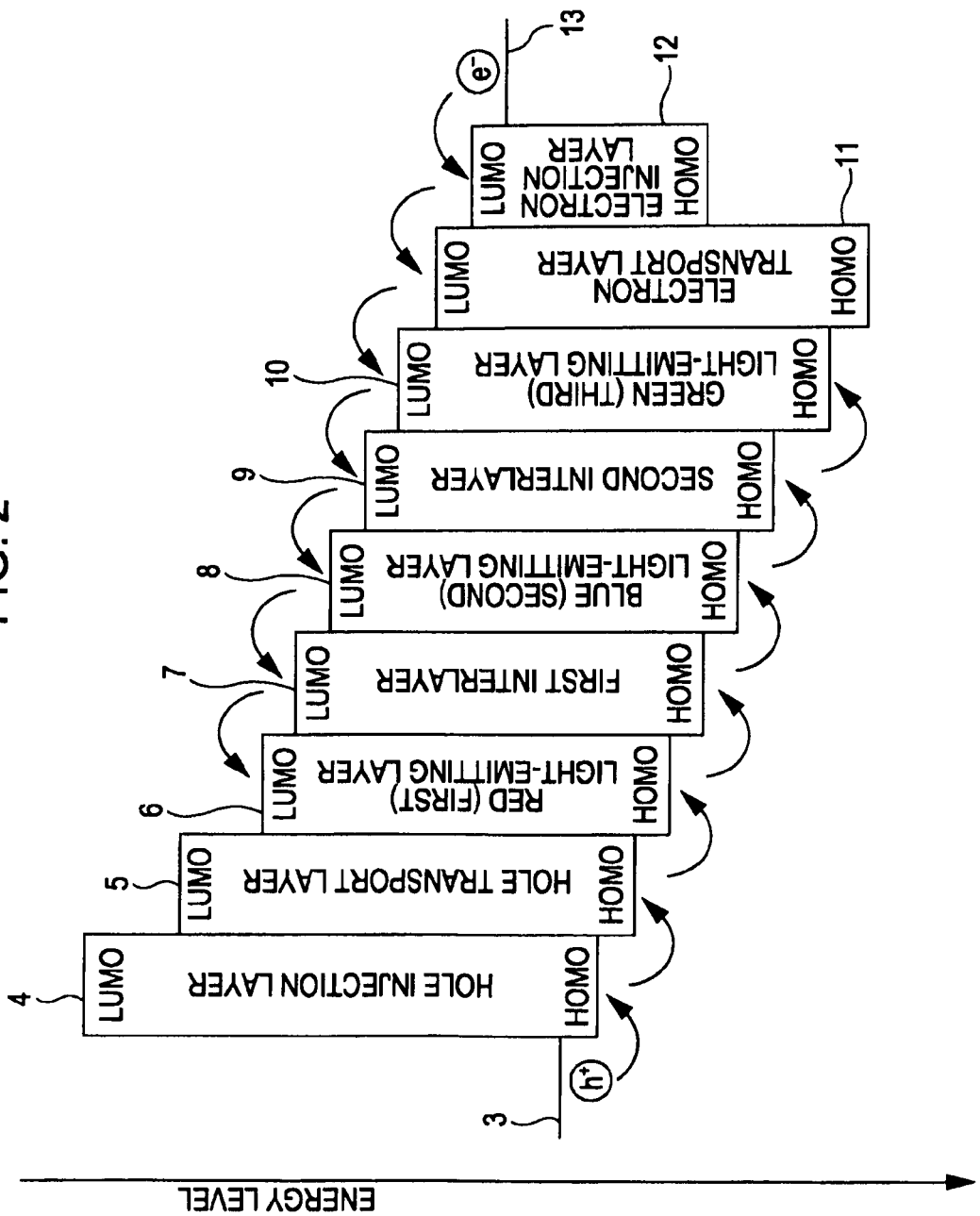
FIG. 2 is a drawing illustrating the energy level of each of layers of the light-emitting element shown in FIG. 1.

FIG. 1 is a schematic longitudinal cross-sectional view of a light-emitting element according to a first embodiment of the invention. FIG. 2 is a drawing illustrating the energy level of each of layers of the light-emitting element shown in FIG. 1. Note that, for the convenience of a description below, the upper side in FIG. 1 is defined as "top", and the lower side in FIG. 1 is defined as "bottom".

A light-emitting element (electroluminescence element) 1 shown in FIG. 1 emits red (R) light, green (G) light, and blue (B) light, thereby emitting white light. The light-emitting element 1 includes an anode 3, a hole injection layer 4, a hole transport layer 5, a red-light-emitting layer (first light-emitting layer) 6, a first interlayer 7, a blue-light-emitting layer (second light-emitting layer) 8, a second interlayer 9, a green-light-emitting layer (third light-emitting layer) 10, an electron transport layer 11, an electron injection layer 12, and a cathode 13, which are laminated in that order.

In other words, the light-emitting element 1 is configured so that a laminate 14 in which the hole injection layer 4, the hole transport layer 5, the red-light-emitting layer 6, the first interlayer 7, the blue-light-emitting layer 8, the second interlayer 9, the green-light-emitting layer 10, the electron transport layer 11, and the electron injection layer 12 are laminated in that order is interposed between the two electrodes (between the anode 3 and the cathode 13). The whole light-emitting element 1 is provided on a substrate 2 and sealed with a sealing member 15.

In the light-emitting element 1, to each of the red-light-emitting layer 6, the blue-light-emitting layer 8, and the green-light-emitting layer 10, an electron is supplied (injected) from the cathode 13 side and a hole is supplied (injected) from the anode 3 side. In each of the light-emitting layers, the electron and the hole are recombined, and an exciton is generated by energy released by this recombination. When the exciton returns to the ground state, energy (fluorescence or phosphorescence) is released (emitted). Thereby, the light-emitting element 1 emits white light.

In particular, in the light-emitting element 1, the first interlayer 7 has a hole-transporting property higher than that of the second interlayer 9, and the second interlayer 9 has an electron-transporting property higher than that of the first interlayer 7. That is, the first interlayer 7 has an excellent hole-transporting property and the second interlayer 9 has an excellent electron-transporting property. Accordingly, a recombination region of carriers can be provided to the light-emitting layers with good balance, and the dependency of the recombination on the current and voltage can be reduced. As a result, the light-emitting layers can emit light with good balance while realizing excellent durability and luminous efficiency. Accordingly, the light-emitting element 1 can emit white light with a very high purity.

The substrate 2 supports the anode 3. The light-emitting element 1 of this embodiment has a structure in which light is extracted from the substrate 2 side (bottom emission structure). Therefore, the substrate 2 and the anode 3 are substantially transparent (transparent and colorless, transparent and colored, or translucent). Examples of the material of the substrate 2 include resin materials such as polyethylene terephthalate, polyethylene naphthalate, polypropylene, cycloolefin polymers, polyamides, polyethersulfones, polymethyl methacrylate, polycarbonates, and polyarylates; and glass materials such as quartz glass and soda glass. These materials may be used alone or in combinations of two or more materials. The average thickness of the substrate 2 is not particularly limited, but is preferably in the range of about 0.1 to 30 mm, and more preferably, in the range of about 0.1 to 10 mm.

When the light-emitting element 1 has a structure in which light is extracted from the side opposite the substrate 2 (top emission structure), either a transparent substrate or an opaque substrate can be used as the substrate 2. In this case, the cathode 13, the sealing member 15, and the like are substantially transparent (transparent and colorless, transparent and colored, or translucent). Examples of the opaque substrate include a substrate made of a ceramic material such as alumina, a substrate produced by forming an oxide film (insulating film) on a surface of a metal substrate such as a stainless steel substrate, and a substrate made of a resin.

Components constituting the light-emitting element 1 will now be sequentially described in detail.

Anode

The anode 3 is an electrode that injects a hole into the hole transport layer 5 through the hole injection layer 4 described below. As the material of the anode 3, a material having a large work function and good conductivity is preferably used.

Examples of the material constituting the anode 3 include oxides such as indium tin oxide (ITO), indium zinc oxide (IZO), $In_2O_3$, $SnO_2$, Sb-containing $SnO_2$, and Al-containing ZnO; and metals such as Au, Pt, Ag, and Cu, and alloys containing these. These materials may be used alone or in combinations of two or more materials. The average thickness of the anode 3 is not particularly limited, but is preferably in the range of about 10 to 200 nm, and more preferably, in the range of about 50 to 150 nm.

Cathode

The cathode 13 is an electrode that injects an electron into the electron transport layer 11 through the electron injection layer 12 described below. As the material of the cathode 13, a material having a small work function is preferably used. Examples of the material constituting the cathode 13 include Li, Mg, Ca, Sr, La, Ce, Er, Eu, Sc, Y, Yb, Ag, Cu, Al, Cs, Rb, and alloys containing these. These materials may be used alone or in combinations of two or more materials (for example, as a laminate including a plurality of layers).

In particular, in the case where an alloy is used as the material of the cathode 13, an alloy containing a stable metal element such as Ag, Al, or Cu, specifically, for example, MgAg, AlLi, or CuLi is preferably used. By using such an alloy as a material of the cathode 13, electron injection efficiency and stability of the cathode 13 can be improved. The average thickness of the cathode 13 is not particularly limited, but is preferably in the range of about 100 to 10,000 nm, and more preferably, in the range of about 200 to 500 nm. The light-emitting element 1 of this embodiment has a bottom emission structure, and thus the cathode 13 does not particularly require optical transparency.

Hole Injection Layer

The hole injection layer 4 has a function of improving hole injection efficiency from the anode 3. Examples of the material constituting the hole injection layer 4 (hole injection material) include, but are not particularly limited to, copper phthalocyanine and 4,4',4''-tris(N,N-phenyl-3-methylphenylamino)triphenylamine (m-MTDATA). The average thickness of the hole injection layer 4 is not particularly limited, but is preferably in the range of about 5 to 150 nm, and more preferably, in the range of about 10 to 100 nm. This hole injection layer 4 may be omitted.

Hole Transport Layer

The hole transport layer 5 has a function of transporting a hole injected from the anode 3 through the hole injection layer 4. In this embodiment, the hole transport layer 5 transports a hole injected from the anode 3 through the hole injection layer 4 to the red-light-emitting layer 6. Examples of the material constituting the hole transport layer 5 (hole transport material) include various types of p-type polymeric materials and various types of p-type low-molecular-weight materials. These materials may be used alone or in combinations.

Examples of the p-type polymeric materials (organic polymers) include polymers having an arylamine skeleton such as polyarylamine; polymers having a fluorene skeleton such as fluorene-bithiophene copolymers; polymers having an arylamine skeleton and a fluorene skeleton such as fluorene-arylamine copolymers; poly(N-vinylcarbazole); polyvinylpyrene; polyvinylanthracene; polythiophene; polyalkylthiophenes; polyhexylthiophene; poly(p-phenylenevinylene); polythienylenevinylene; a pyrene-formaldehyde resin; an ethylcarbazole-formaldehyde resin; and derivatives thereof. These p-type polymeric materials can be used as a mixture with another compound. An example of a mixture containing polythiophene is poly(3,4-ethylenedioxythiophene/styrenesulfonic acid) (PEDOT/PSS).

Examples of the p-type low-molecular-weight materials include aryl cycloalkane compounds such as 1,1-bis(4-di-para-triaminophenyl)cyclohexane and 1,1'-bis(4-di-para-tolylaminophenyl)-4-phenyl-cyclohexane; arylamine compounds such as 4,4',4''-trimethyltriphenylamine, N,N,N',N'-tetraphenyl-1,1'-biphenyl-4,4'-diamine, N,N'-diphenyl-N,N'-bis(3-methylphenyl)-1,1-biphenyl-4,4'-diamine (TPD1), N,N'-diphenyl-N,N'-bis(4-methoxyphenyl)-1,1'-biphenyl-4, 4'-diamine (TPD2), N,N,N',N'-tetrakis(4-methoxyphenyl)-1, 1'-biphenyl-4,4'-diamine (TPD3), N,N'-bis(1-naphthyl)-N, N'-diphenyl-1,1'-biphenyl-4,4'-diamine (α-NPD), and TPTE; phenylenediamine compounds such as N,N,N',N'-tetraphenyl-para-phenylenediamine, N,N,N',N'-tetra(para-tolyl)-para-phenylenediamine, and N,N,N',N'-tetra(meta-tolyl)-meta-phenylenediamine (PDA); carbazole compounds such as carbazole, N-isopropylcarbazole, and N-phenylcarbazole; stilbene compounds such as stilbene and 4-di-para-tolylaminostilbene; oxazole compounds such as OxZ; triphenylmethane compounds such as triphenylmethane and m-MTDATA; pyrazoline compounds such as 1-phenyl-3-(para-dimethylaminophenyl)pyrazoline; benzine(cyclohexadiene) compounds; triazole compounds such as triazole; imidazole compounds such as imidazole; oxadiazole compounds such as 1,3,4-oxadiazole and 2,5-di(4-dimethylaminophenyl)-1,3,4-oxadiazole; anthracene compounds such as anthracene and 9-(4-diethylaminostyryl)anthracene; fluorenone compounds such as fluorenone, 2,4,7-trinitro-9-fluorenone, and 2,7-bis(2-hydroxy-3-(2-chlorophenylcarbamoyl)-1-naphthylazo)fluorenone; aniline compounds such as polyaniline; silane compounds; pyrrole compounds such as 1,4-dithioketo-3,6-diphenyl-pyrrolo-(3,4-c)pyrrolopyrrole; fluorene compounds such as fluorene; porphyrin compounds such as porphyrin and metal tetraphenylporphyrins; quinacridone compounds such as quinacridone; metal or metal-free phthalocyanine compounds such as phthalocyanine, copper phthalocyanine, tetra(tert-butyl)copper phthalocyanine, and iron phthalocyanine; metal or metal-free naphthalocyanine compounds such as copper naphthalocyanine, vanadyl naphthalocyanine, and monochloro gallium naphthalocyanine; and benzidine compounds such as N,N'-di(naphthalen-1-yl)-N,N'-diphenyl-benzidine and N,N,N',N'-tetraphenylbenzidine.

Among these, a material mainly containing a low-molecular-weight material is preferably used as the material of the hole transport layer 5. In such a case, by forming the hole transport layer 5 using a vapor-phase deposition method such as vacuum evaporation, the hole transport layer 5 can be easily formed as a homogeneous thin film. When the red-light-emitting layer 6 described below is formed by a vapor-phase deposition method such as vacuum evaporation on the hole transport layer 5 formed as such a homogeneous thin film, the red-light-emitting layer 6 can also be formed as a homogeneous thin film. Accordingly, light-emitting elements 1 which have excellent characteristics and which can realize uniform light emission can be produced with a high yield. The average thickness of the hole transport layer 5 is not particularly limited, but is preferably in the range of about 10 to 150 nm, and more preferably, in the range of about 10 to 100 nm. This hole transport layer 5 may be omitted.

Red-light-emitting Layer

The red-light-emitting layer (first light-emitting layer) 6 contains a red-light-emitting material that emits red (first color) light. Examples of the red-light-emitting material include, but are not particularly limited to, various types of red fluorescent materials and red phosphorescent materials. These materials may be used alone or in combinations of two or more materials.

The red fluorescent materials are not particularly limited as long as the materials emit red fluorescence. Examples thereof include perylene derivatives, europium complexes, benzopyran derivatives, rhodamine derivatives, benzothioxanthene derivatives, porphyrin derivatives, Nile red, 2-(1,1-dimethylethyl)-6-(2-(2,3,6,7-tetrahydro-1,1,7,7-tetramethyl-1H,5H-benzo(ij)quinolizin-9-yl)ethenyl)-4H-pyran-4H-ylidene) propanedinitrile (DCJTB), 4-(dicyanomethylene)-2-methyl-6-(p-dimethylaminostyryl)-4H-pyran (DCM), poly[2,5-bis (3,7-dimethyloctyloxy)-1,4-phenylenevinylene], poly[2-methoxy-5-(2'-ethylhexyloxy)-1,4-(1-cyanovinylene) phenylene], and poly[2-methoxy-5-(3,7-dimethyloctyloxy)-1,4-phenylenevinylene].

The red phosphorescent materials are not particularly limited as long as the materials emit red phosphorescence. Examples of the red phosphorescent material include complexes of a metal such as iridium, ruthenium, platinum, osmium, rhenium, or palladium. Examples thereof further include compounds in which at least one ligand of the above-mentioned metal complexes has a phenylpyridine skeleton, a bipyridyl skeleton, a porphyrin skeleton, or the like. More specifically, examples thereof include tris(1-phenylisoquinoline)iridium, bis[2-(2'-benzo[4,5-a]thienyl)pyridinate-N, C3']iridium(acetylacetonate) (btp2Ir(acac)), 2,3,7,8,12,13, 17,18-octaethyl-12H,23H-porphyrin-platinum(II), bis[2-(2'-benzo[4,5-α]thienyl)pyridinate-N,C3,]iridium, and bis(2-phenylpyridine)iridium(acetylacetonate).

As the material constituting the red-light-emitting layer 6, a host material can be used in combination with the above-mentioned red-light-emitting material functioning as a guest material. The host material has a function of recombining a hole and an electron to generate an exciton, transferring energy of the exciton to the red-light-emitting material (Forster transfer or Dexter transfer), and exciting the red-light-emitting material. When such a host material is used, for example, a red-light-emitting material functioning as a guest material may be doped into the host material as a dopant.

The host material is not particularly limited as long as the host material has the above-described function to the red-light-emitting material used. When the red-light-emitting material contains a red fluorescent material, examples of the host material include distyrylarylene derivatives, naphthacene derivatives, perylene derivatives, distyrylbenzene derivatives, distyrylamine derivatives, quinolinolato metal complexes such as tris(8-quinolinolato)aluminum complex (Alq$_3$), triarylamine derivatives such as triphenylamine tetramer, oxadiazole derivatives, silole derivatives, dicarbazole derivatives, oligothiophene derivatives, benzopyran derivatives, triazole derivatives, benzoxazole derivatives, benzothiazole derivatives, quinoline derivatives, and 4,4'-bis(2, 2'-diphenylvinyl)biphenyl (DPVBi). These materials may be used alone or in combinations of two or more materials.

When the red-light-emitting material contains a red phosphorescent material, examples of the host material include carbazole derivatives such as 3-phenyl-4-(1'-naphthyl)-5-phenylcarbazole and 4,4'-N,N'-dicarbazolebiphenyl (CBP); phenanthroline derivatives; triazole derivatives; quinolinolato metal complexes such as tris(8-quinolinolato)aluminum (Alq) and bis-(2-methyl-8-quinolinolato)-4-(phenylphenolato)aluminum; carbazolyl group-containing compounds such as N-dicarbazolyl-3,5-benzene, poly(9-vinylcarbazole), 4,4',4''-tris(9-carbazolyl)triphenylamine, 4,4'-bis(9-carbazolyl)-2,2'-dimethylbiphenyl; and 2,9-dimethyl-4,7-diphenyl-1,10-phenanthroline (BCP). These materials may be used alone or in combinations of two or more materials.

When the above-mentioned red-light-emitting material (guest material) and a host material are used, the amount of red-light-emitting material (the amount of doping) contained in the red-light-emitting layer 6 is preferably in the range of 0.01 to 10 weight percent, and more preferably, in the range of 0.1 to 5 weight percent. By controlling the content of the red-light-emitting material within this range, light can be emitted from the red-light-emitting layer 6 while the amount of light emitted from the red-light-emitting layer 6 is balanced with the amounts of light emitted from the blue-light-emitting layer 8 and the green-light-emitting layer 10 described below.

First Interlayer

The first interlayer 7 is provided between the red-light-emitting layer 6 described above and the blue-light-emitting layer 8 described below so as to be in contact with these layers. The first interlayer 7 has a function of preventing energy of an exciton from transferring between the red-light-emitting layer 6 and the blue-light-emitting layer 8. This function enables each of the red-light-emitting layer 6 and the blue-light-emitting layer 8 to emit light with high efficiency.

The first interlayer 7 has a hole-transporting property and an electron-transporting property. Accordingly, the first interlayer 7 can smoothly transfer holes and electrons between the red-light-emitting layer 6 and the blue-light-emitting layer 8. In particular, the first interlayer 7 has a relatively high hole-transporting property. Specifically, the first interlayer 7 has a hole-transporting property higher than that of the second interlayer 9 described below. Accordingly, holes can be smoothly transferred from the red-light-emitting layer 6 to the blue-light-emitting layer 8 through the first interlayer 7. By appropriately selecting a material constituting the first interlayer 7, light can be emitted from the red-light-emitting layer 6 and the blue-light-emitting layer 8 with good balance.

The material of the first interlayer 7 is not particularly limited as long as the material exerts the function described above. For example, various types of hole transport materials described above, various types of electron transport materials, and various types of bipolar materials described below can be used alone or in combinations of two or more materials. When the first interlayer 7 is composed of two or more types of materials, the two or more types of materials may be used as a mixture or each of the materials may be laminated as described in a second embodiment below.

In the light-emitting element 1, as shown in FIG. 2, it is preferable that the energy level of each of the highest occupied molecular orbital (HOMO) and the lowest unoccupied molecular orbital (LUMO) of the material of each of the layers constituting the light-emitting element 1 become sequentially high from the anode 3 side to the cathode 13 side. By setting the highest occupied molecular orbital (HOMO) and the lowest unoccupied molecular orbital (LUMO) of the material of each of the layers constituting the light-emitting element 1 in this manner, an excellent injection balance of carriers in the layers can be realized while reducing the driving voltage of the light-emitting element 1. Note that, in FIG. 2, the energy level becomes high from the upper side to the lower side. In this specification, the smaller the amount of energy (electric potential [eV]), the higher the energy level, and the larger the amount of energy (electric potential [eV]), the lower the energy level. Accordingly, in FIG. 2, the amount of energy (electric potential [eV]) becomes small from the upper side to the lower side.

The highest occupied molecular orbital (HOMO) and the lowest unoccupied molecular orbital (LUMO) of the first interlayer 7 will be described in more detail with reference to FIG. 2. The energy level of the highest occupied molecular orbital of the material constituting the first interlayer 7 is higher than the energy level of the highest occupied molecular orbital of the material constituting the red-light-emitting layer (first light-emitting layer) 6. Consequently, the first interlayer 7 limits the amount of movement of holes from the red-light-emitting layer 6 to the blue-light-emitting layer 8, and thus light can be emitted from the red-light-emitting layer 6 and the blue-light-emitting layer 8 with good balance.

In this specification, when a light-emitting layer such as the red-light-emitting layer 6 or the blue-light-emitting layer 8 is composed of only a light-emitting material, the highest occupied molecular orbital (HOMO) and the lowest unoccupied molecular orbital (LUMO) of the material constituting the light-emitting layer mean the highest occupied molecular orbital (HOMO) and the lowest unoccupied molecular orbital (LUMO), respectively, of the light-emitting material. When the light-emitting layer is composed of a light-emitting material (guest material) and a host material, the highest occupied molecular orbital (HOMO) and the lowest unoccupied molecular orbital (LUMO) of the material constituting the light-emitting layer mean the highest occupied molecular orbital (HOMO) and the lowest unoccupied molecular orbital (LUMO), respectively, of either the light-emitting material or the host material. In this specification, when an interlayer (such as the first interlayer 7 or the second interlayer 9) is composed of a single type of material, the highest occupied molecular orbital (HOMO) and the lowest unoccupied molecular orbital (LUMO) of the material constituting the interlayer mean the highest occupied molecular orbital (HOMO) and the lowest unoccupied molecular orbital (LUMO), respectively, of the single type of material. When the interlayer is composed of two or more types of materials, the highest occupied molecular orbital (HOMO) and the lowest unoccupied molecular orbital (LUMO) of the material constituting the interlayer mean the highest occupied molecular orbital (HOMO) and the lowest unoccupied molecular orbital (LUMO), respectively, of any one material of the two or more types of materials (in particular, a material having the lowest MOHO or LUMO).

In addition, the energy level of the highest occupied molecular orbital of the material constituting the first interlayer 7 lies between the energy level of the highest occupied molecular orbital of the material constituting the red-light-emitting layer 6 and the energy level of the highest occupied molecular orbital of the material constituting the blue-light-emitting layer 8. Accordingly, by reducing the energy gap between the highest occupied molecular orbital of the material constituting the red-light-emitting layer 6 and the highest occupied molecular orbital of the material constituting the blue-light-emitting layer 8 (by reducing the height of a barrier due to the energy gap), the driving voltage of the light-emitting element 1 can be reduced.

In particular, when there is the relationship among the energy levels of the highest occupied molecular orbitals shown in FIG. 2, the difference between the energy level of the highest occupied molecular orbital of the material constituting the first interlayer 7 and the energy level of the highest occupied molecular orbital of each of the materials constituting the red-light-emitting layer 6 and the blue-light-emitting layer 8 is preferably in the range of 0.1 to 0.4 eV. In this case, the driving voltage of the light-emitting element 1 can be reduced while achieving an excellent light-emission balance between the red-light-emitting layer 6 and the blue-light-emitting layer 8.

Furthermore, the energy level of the lowest unoccupied molecular orbital of the material constituting the first interlayer 7 is lower than the energy level of the lowest unoccupied molecular orbital of the material constituting the blue-light-emitting layer 8 (second light-emitting layer). Consequently, the first interlayer 7 limits the amount of movement of electrons from the blue-light-emitting layer 8 to the red-light-emitting layer 6, and thus light can be emitted from the red-light-emitting layer 6 and the blue-light-emitting layer 8 with good balance. In addition, the energy level of the lowest unoccupied molecular orbital of the material constituting the first interlayer 7 lies between the energy level of the lowest unoccupied molecular orbital of the material constituting the red-light-emitting layer 6 and the energy level of the lowest unoccupied molecular orbital of the material constituting the blue-light-emitting layer 8. Accordingly, by reducing the energy gap between the lowest unoccupied molecular orbital of the material constituting the red-light-emitting layer 6 and the lowest unoccupied molecular orbital of the material constituting the blue-light-emitting layer 8 (by reducing the height of a barrier due to the energy gap), the driving voltage of the light-emitting element 1 can be reduced.

In particular, when there is the relationship among the energy levels of the lowest unoccupied molecular orbitals shown in FIG. 2, the difference between the energy level of the lowest unoccupied molecular orbital of the material constituting the first interlayer 7 and the energy level of the lowest unoccupied molecular orbital of each of the materials constituting the red-light-emitting layer 6 and the blue-light-emitting layer 8 is preferably in the range of 0.1 to 0.4 eV. In this case, the driving voltage of the light-emitting element 1 can be reduced while achieving an excellent light-emission balance between the red-light-emitting layer 6 and the blue-light-emitting layer 8.

Furthermore, the energy gap (band-gap) between the lowest unoccupied molecular orbital and the highest occupied molecular orbital of the material constituting the first interlayer 7 is preferably larger than the energy gap (band-gap) between the lowest unoccupied molecular orbital and the highest occupied molecular orbital of each of the materials constituting the red-light-emitting layer 6 and the blue-light-emitting layer 8. This structure can prevent energy of an exciton generated in the red-light-emitting layer 6 or the blue-light-emitting layer 8 from transferring to the first interlayer 7. As a result, light can be emitted from the red-light-emitting layer 6 and the blue-light-emitting layer 8 with good balance. As the material constituting the first interlayer 7, a material having a good carrier- (in particular, hole-) transporting property and a material having good carrier resistance are preferably used in combination. Consequently, excellent durability and luminous efficiency (current efficiency and driving voltage) can be achieved while realizing well-balanced light emission of the red-light-emitting layer 6 and light emission of the blue-light-emitting layer 8 as described above.

From this point of view, the first interlayer 7 preferably contains an amine hole transport material. Amine hole transport materials have an excellent hole-transporting property. Therefore, by using such a hole transport material as the material of the first interlayer 7, transfer of a hole from the red-light-emitting layer 6 to the blue-light-emitting layer 8 through the first interlayer 7 can be performed very smoothly.

The amine hole transport material used for the first interlayer 7 is not particularly limited as long as the material has an amine skeleton and achieves the advantage described above. For example, among the above-mentioned hole transport materials, compounds having an amine skeleton can be used.

Benzidine amine derivatives are preferably used. In particular, among benzidine amine derivatives, as the amine hole transport material used for the first interlayer 7, benzidine amine derivatives in which two or more naphthyl groups are introduced are preferable. Examples of such a benzidine amine derivative include N,N'-bis(1-naphthyl)-N,N'-diphenyl[1,1'-biphenyl]-4,4'-diamine (α-NPD) represented by Chemical Formula 1 below and N,N,N',N'-tetranaphthylbenzidine (TNB) represented by Chemical Formula 2 below.

Chemical Formula 1

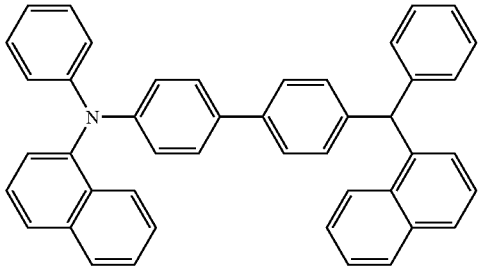

Chemical Formula 2

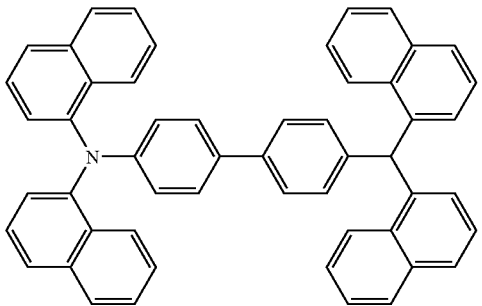

Such amine hole transport materials have a good hole-transporting property. The hole mobility of amine hole transport materials is higher than the hole mobility of silole electron transport materials and acene bipolar materials described below. Accordingly, holes can be smoothly transferred from the red-light-emitting layer 6 to the blue-light-emitting layer 8 through the first interlayer 7. The content of the amine hole transport material in the first interlayer 7 is not particularly limited, but preferably in the range of 10 to 90 volume percent, more preferably in the range of 30 to 70 volume percent, and further preferably in the range of 40 to 60 volume percent.

Furthermore, the first interlayer 7 preferably contains an acene bipolar material. Acene bipolar materials have good carrier-transporting properties (hole-transporting property and electron-transporting property) and carrier resistance. Therefore, when such a bipolar material is used as the material constituting the first interlayer 7, transfer of a hole from the red-light-emitting layer 6 to the blue-light-emitting layer 8 through the first interlayer 7 and transfer of an electron from the blue-light-emitting layer 8 to the red-light-emitting layer 6 through the first interlayer 7 can be performed very smoothly while realizing good carrier resistance of the first interlayer 7.

Acene bipolar materials contained in the first interlayer 7 have good resistance to excitons. Accordingly, in particular, even when an electron and a hole are recombined in such a first interlayer 7 to generate an exciton, degradation of the first interlayer 7 can be prevented or suppressed. Thereby, degradation of the first interlayer 7 by an exciton is prevented or suppressed, and consequently, the light-emitting element 1 can have excellent durability. When such an acene bipolar material is used as a material of the first interlayer 7 in combination with (for example, as a mixture with) an amine hole transport material as described above, the durability and the luminous efficiency of the light-emitting element 1 can be further improved.

The acene bipolar material is not particularly limited as long as the material has an acene skeleton and achieves the advantages described above. Examples thereof include naphthalene derivatives, anthracene derivatives, tetracene derivatives, pentacene derivatives, hexacene derivatives, and heptacene derivatives. These materials may be used alone or in combinations of two or more materials. Anthracene derivatives are preferably used.

Anthracene derivatives have an excellent electron-transporting property and hole-transporting property, and films of anthracene derivatives can be easily formed by a vapor-phase deposition method. Accordingly, by using an anthracene derivative as the acene bipolar material, a homogeneous first interlayer 7 can be easily formed while realizing a good electron-transporting property and hole-transporting property of the acene bipolar material (furthermore, first interlayer 7).

In particular, among anthracene derivatives, as the acene bipolar material used for the first interlayer 7, compounds in which a naphthyl group is introduced to each of the 9-position and the 10-position of an anthracene skeleton are preferable. In this case, the advantages described above are significantly achieved. Examples of such an anthracene derivative include 9,10-di(2-naphthyl)anthracene (ADN) represented by Chemical Formula 3 below, 2-tert-butyl-9,10-di(2-naphthyl) anthracene (TBADN) represented by Chemical Formula 4 below, and 2-methyl-9,10-di(2-naphthyl)anthracene (MADN) represented by Chemical Formula 5 below.

Chemical Formula 3

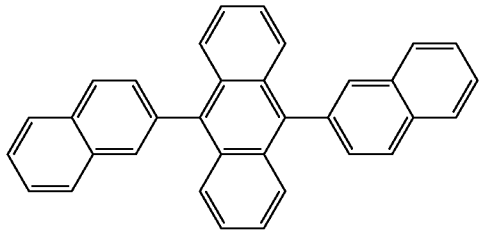

Chemical Formula 4

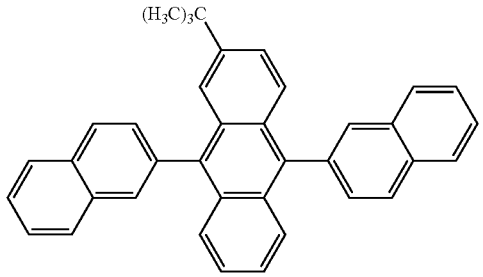

-continued

Chemical Formula 5

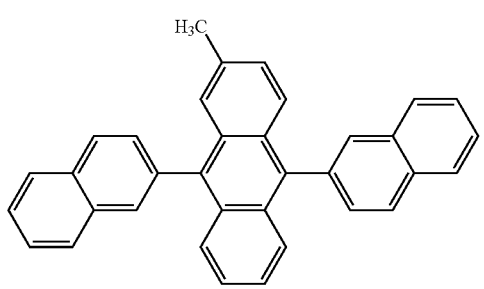

Such acene bipolar materials have an excellent electron-transporting property and hole-transporting property. The content of the acene bipolar material in the first interlayer 7 is not particularly limited, but preferably in the range of 10 to 90 volume percent, more preferably in the range of 30 to 70 volume percent, and further preferably in the range of 40 to 60 volume percent. The first interlayer 7 may contain a material other than the materials described above. The average thickness of the first interlayer 7 is preferably 100 nm or less (in the range of 1 to 100 nm), more preferably in the range of 3 to 50 nm, and further preferably in the range of 5 to 30 nm. Accordingly, light can be emitted from the red-light-emitting layer 6 and the blue-light-emitting layer 8 with good balance while reducing the driving voltage of the light-emitting element 1.

When the thickness of the first interlayer 7 is smaller than the above lower limit, it is difficult to realize excellent durability and current efficiency in some cases depending on, for example, the type of material of the first interlayer 7 and the film quality thereof. For some thicknesses of the first interlayer 7 and the like, the first interlayer 7 cannot satisfactorily prevent energy transfer of an exciton between the red-light-emitting layer 6 and the blue-light-emitting layer 8, and thus it is difficult for light to be emitted from the red-light-emitting layer 6 and the blue-light-emitting layer 8 with good balance. On the other hand, when the thickness of the first interlayer 7 exceeds the upper limit, the driving voltage of the light-emitting element 1 tends to increase.

Blue-light-Emitting Layer

The blue-light-emitting layer (second light-emitting layer) 8 contains a blue-light-emitting material that emits blue (second color) light. Examples of the blue-light-emitting material include, but are not particularly limited to, various types of blue fluorescent materials and blue phosphorescent materials. These materials may be used alone or in combinations of two or more materials.

The blue fluorescent materials are not particularly limited as long as the materials emit blue fluorescence. Examples thereof include distyryl derivatives, fluoranthene derivatives, pyrene derivatives, perylene and perylene derivatives, anthracene derivatives, benzoxazole derivatives, benzothiazole derivatives, benzimidazole derivatives, chrysene derivatives, phenanthrene derivatives, distyrylbenzene derivatives, tetraphenylbutadiene, 4,4'-bis(9-ethyl-3-carbazovinylene)-1,1'-biphenyl (BCzVBi), poly[(9,9-dioctylfluorene-2,7-diyl)-co-(2,5-dimethoxybenzene-1,4-diyl)], poly[(9,9-dihexyloxyfluorene-2,7-diyl)-ortho-co-(2-methoxy-5-{2-ethoxyhexyloxy}-phenylene-1,4-diyl)], and poly[(9,9-dioctylfluorene-2,7-diyl)-co-(ethynylbenzene)]. These materials may be used alone or in combinations of two or more materials.

The blue phosphorescent materials are not particularly limited as long as the materials emit blue phosphorescence. Examples of the blue phosphorescent material include complexes of a metal such as iridium, ruthenium, platinum, osmium, rhenium, or palladium. More specifically, examples thereof include bis[4,6-difluorophenylpyridinate-N,C2']-picolinate-iridium, tris[2-(2,4-difluorophenyl)pyridinate-N,C2']iridium, bis[2-(3,5-trifluoromethyl)pyridinate-N,C2']-picolinate-iridium, and bis(4,6-difluorophenylpyridinate-N,C2')iridium(acetylacetonate). As the material constituting the blue-light-emitting layer 8, a host material can be used in combination with the above-mentioned blue-light-emitting material functioning as a guest material as in the red-light-emitting layer 6.

When the above-mentioned blue-light-emitting material (guest material) and a host material are used, the amount of blue-light-emitting material (the amount of doping) contained in the blue-light-emitting layer 8 is preferably in the range of 0.01 to 10 weight percent, and more preferably, in the range of 0.1 to 5 weight percent. By controlling the content of the blue-light-emitting material within this range, light can be emitted from the blue-light-emitting layer 8 while the amount of light emitted from the blue-light-emitting layer 8 is balanced with the amounts of light emitted from the red-light-emitting layer 6 described above and the green-light-emitting layer 10 described below.

Second Interlayer

The second interlayer 9 is provided between the blue-light-emitting layer 8 described above and the green-light-emitting layer 10 described below so as to be in contact with these layers. The second interlayer 9 has a function of preventing energy of an exciton from transferring between the blue-light-emitting layer 8 and the green-light-emitting layer 10. This function enables each of the blue-light-emitting layer 8 and the green-light-emitting layer 10 to emit light with high efficiency.

The second interlayer 9 has a hole-transporting property and an electron-transporting property. Accordingly, the second interlayer 9 can smoothly transfer holes and electrons between the blue-light-emitting layer 8 and the green-light-emitting layer 10. In particular, the second interlayer 9 has a relatively high electron-transporting property. Specifically, the second interlayer 9 has an electron-transporting property higher than that of the first interlayer 7 described above. Accordingly, electrons can be smoothly transferred from the green-light-emitting layer 10 to the blue-light-emitting layer 8 through the second interlayer 9. By appropriately selecting the material constituting the second interlayer 9, light can be emitted from the blue-light-emitting layer 8 and the green-light-emitting layer 10 with good balance.

The material of the second interlayer 9 is not particularly limited as long as the material exerts the function described above. For example, various types of hole transport materials described above, various types of electron transport materials, and various types of bipolar materials described below can be used alone or in combinations of two or more materials. When the second interlayer 9 is composed of two or more types of materials, the two or more types of materials may be used as a mixture or each of the materials may be laminated as described in a second embodiment below.

The highest occupied molecular orbital (HOMO) and the lowest unoccupied molecular orbital (LUMO) of the second interlayer 9 will be described in more detail with reference to FIG. 2. The energy level of the highest occupied molecular orbital of the material constituting the second interlayer 9 is higher than the energy level of the highest occupied molecular orbital of the material constituting the blue-light-emitting layer 8 (second light-emitting layer). Consequently, the second interlayer 9 limits the amount of movement of holes from the blue-light-emitting layer 8 to the green-light-emitting layer 10, and thus light can be emitted from the blue-light-emitting layer 8 and the green-light-emitting layer 10 with good balance.

In addition, the energy level of the highest occupied molecular orbital of the material constituting the second interlayer 9 lies between the energy level of the highest occupied molecular orbital of the material constituting the blue-light-emitting layer 8 and the energy level of the highest occupied molecular orbital of the material constituting the green-light-emitting layer 10. Accordingly, by reducing the energy gap between the highest occupied molecular orbital of the material constituting the blue-light-emitting layer 8 and the highest occupied molecular orbital of the material constituting the green-light-emitting layer 10 (by reducing the height of a barrier due to the energy gap), the driving voltage of the light-emitting element 1 can be reduced.

In particular, when there is the relationship among the energy levels of the highest occupied molecular orbitals shown in FIG. 2, the difference between the energy level of the highest occupied molecular orbital of the material constituting the second interlayer 9 and the energy level of the highest occupied molecular orbital of each of the materials constituting the blue-light-emitting layer 8 and the green-light-emitting layer 10 is preferably in the range of 0.1 to 0.4 eV. In this case, the driving voltage of the light-emitting element 1 can be reduced while achieving an excellent light-emission balance between the blue-light-emitting layer 8 and the green-light-emitting layer 10.

Furthermore, the energy level of the lowest unoccupied molecular orbital of the material constituting the second interlayer 9 is lower than the energy level of the lowest unoccupied molecular orbital of the material constituting the green-light-emitting layer 10. Consequently, the second interlayer 9 limits the amount of movement of electrons from the green-light-emitting layer 10 to the blue-light-emitting layer 8, and thus light can be emitted from the blue-light-emitting layer 8 and the green-light-emitting layer 10 with good balance. In addition, the energy level of the lowest unoccupied molecular orbital of the material constituting the second interlayer 9 lies between the energy level of the lowest unoccupied molecular orbital of the material constituting the blue-light-emitting layer 8 and the energy level of the lowest unoccupied molecular orbital of the material constituting the green-light-emitting layer 10. Accordingly, by reducing the energy gap between the lowest unoccupied molecular orbital of the material constituting the blue-light-emitting layer 8 and the lowest unoccupied molecular orbital of the material constituting the green-light-emitting layer 10 (by reducing the height of a barrier due to the energy gap), the driving voltage of the light-emitting element 1 can be reduced.

In particular, when there is the relationship among the energy levels of the lowest unoccupied molecular orbitals shown in FIG. 2, the difference between the energy level of the lowest unoccupied molecular orbital of the material constituting the second interlayer 9 and the energy level of the lowest unoccupied molecular orbital of each of the materials constituting the blue-light-emitting layer 8 and the green-light-emitting layer 10 is preferably in the range of 0.1 to 0.4 eV. In this case, the driving voltage of the light-emitting element 1 can be reduced while achieving an excellent light-emission balance between the blue-light-emitting layer 8 and the green-light-emitting layer 10.

Furthermore, the energy gap (band-gap) between the lowest unoccupied molecular orbital and the highest occupied molecular orbital of the material constituting the second interlayer 9 is preferably larger than the energy gap (band-gap) between the lowest unoccupied molecular orbital and the highest occupied molecular orbital of each of the materials constituting the blue-light-emitting layer 8 and the green-light-emitting layer 10. This structure can prevent energy of an exciton generated in the blue-light-emitting layer 8 or the green-light-emitting layer 10 from transferring to the second interlayer 9. As a result, light can be emitted from the blue-light-emitting layer 8 and the green-light-emitting layer 10 with good balance. As the material constituting the second interlayer 9, a material having a good carrier- (in particular, electron-) transporting property and a material having good carrier resistance are preferably used in combination. Consequently, excellent durability and luminous efficiency (current efficiency and driving voltage) can be achieved while realizing well-balanced light emission of the blue-light-emitting layer 8 and light emission of the green-light-emitting layer 10 as described above.

From this point of view, the second interlayer 9 preferably contains a silole (silacyclopentadiene) electron transport material (i.e., electron transport material having a silole ring skeleton). Silole electron transport materials have an excellent electron-transporting property. Therefore, by using such an electron transport material as the material of the second interlayer 9, transfer of an electron from the green-light-emitting layer 10 to the blue-light-emitting layer 8 through the second interlayer 9 can be performed very smoothly. In addition, the energy level of the lowest unoccupied molecular orbital of silole electron transport materials is very low. Therefore, the silole electron transport materials are suitable for satisfying the above-described relationship among the energy levels. The silole electron transport material is not particularly limited as long as the material has a silole ring skeleton and achieves the advantage described above. Examples thereof include silacyclopentadiene derivatives represented by Chemical Formulae 6 and 7 below.

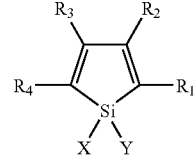

Chemical Formula 6

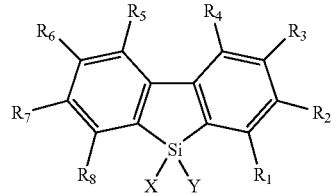

Chemical Formula 7

(In Chemical Formulae 6 and 7, each of X and Y independently represents a saturated or unsaturated hydrocarbon group having 1 to 6 carbon atoms, an alkoxy group, an alkenyloxy group, an alkynyloxy group, a hydroxy group, a substituted or unsubstituted aryl group, or a substituted or unsubstituted heterocycle, or X and Y may be bonded to form a saturated or unsaturated ring; and each of $R_1$ to $R_8$ independently represents hydrogen, a halogen, a substituted or unsubstituted alkyl group having 1 to 6 carbon atoms, an alkoxy group, an aryloxy group, a perfluoroalkyl group, a perfluoroalkoxy group, an amino group, an alkylcarbonyl group, an arylcarbonyl group, an alkoxycarbonyl group, an aryloxycarbonyl group, an azo group, an alkylcarbonyloxy group, an arylcarbonyoxy group, an alkoxycarbonyoxy group, an aryloxycarbonyloxy group, sulfinyl group, a sulfonyl group, a sulfanyl group, a silyl group, a carbamoyl group, an aryl group, a heterocycle group, an alkenyl group, an alkynyl group, a nitro group, a formyl group, a nitroso group, a formyloxy group, an isocyano group, a cyanate group, an isocyanate group, a thiocyanate group, an isothiocyanate group, or a cyano group, or any of adjacent $R_1$ to $R_8$ may form a substituted or unsubstituted fused ring.

Such silole electron transport materials have a good electron-transporting property. The electron mobility of silole electron transport materials is higher than the electron mobility of the above-described amine hole transport materials and the acene bipolar materials. Accordingly, electrons can be smoothly transferred from the green-light-emitting layer 10 to the blue-light-emitting layer 8 through the second interlayer 9. The content of the silole electron transport material in the second interlayer 9 is not particularly limited, but preferably in the range of 10 to 90 volume percent, more preferably in the range of 30 to 70 volume percent, and further preferably in the range of 40 to 60 volume percent.

Furthermore, the second interlayer 9 preferably contains the above-described acene bipolar material. As described above, acene bipolar materials have good carrier-transporting properties (hole-transporting property and electron-transporting property) and carrier resistance. Therefore, when such a bipolar material is used as the material constituting the second interlayer 9, transfer of a hole from the blue-light-emitting layer 8 to the green-light-emitting layer 10 through the second interlayer 9 and transfer of an electron from the green-light-emitting layer 10 to the blue-light-emitting layer 8 through the second interlayer 9 can be performed very smoothly while realizing good carrier resistance of the second interlayer 9.

Acene bipolar materials contained in the second interlayer 9 have good resistance to excitons. Accordingly, in particular, even when an electron and a hole are recombined in such a second interlayer 9 to generate an exciton, degradation of the second interlayer 9 can be prevented or suppressed. Thereby, degradation of the second interlayer 9 by an exciton is prevented or suppressed, and consequently, the light-emitting element 1 can have excellent durability. When such an acene bipolar material is used as a material of the second interlayer 9 in combination with (for example, as a mixture with) a silole electron transport material as described above, the durability and the luminous efficiency of the light-emitting element 1 can be further improved.

As the acene bipolar material used as the material constituting the second interlayer 9, the same acene bipolar materials as those used as the material constituting the first interlayer 7 can be used. In the case where acene bipolar materials are used as the materials of the first interlayer 7 and the second interlayer 9, an acene bipolar material used as the material of the second interlayer 9 may be the same as or different from an acene bipolar material used as the material of the first interlayer 7 as long as the second interlayer 9 has the above-described function.

The content of the acene bipolar material in the second interlayer 9 is not particularly limited, but preferably in the range of 10 to 90 volume percent, more preferably in the range of 30 to 70 volume percent, and further preferably in the range of 40 to 60 volume percent. The second interlayer 9 may contain a material other than the materials described above. The average thickness of the second interlayer 9 is preferably 100 nm or less (in the range of 1 to 100 nm), more preferably in the range of 3 to 50 nm, and further preferably in the range of 5 to 30 nm. Accordingly, light can be emitted from the blue-light-emitting layer 8 and the green-light-emitting layer 10 with good balance while reducing the driving voltage of the light-emitting element 1.

When the thickness of the second interlayer 9 is smaller than the above lower limit, it is difficult to realize excellent durability and current efficiency in some cases depending on, for example, the type of material of the second interlayer 9 and the film quality thereof. For some thicknesses of the second interlayer 9 and the like, the second interlayer 9 cannot satisfactorily prevent energy transfer of an exciton between the blue-light-emitting layer 8 and the green-light-emitting layer 10, and thus it is difficult for light to be emitted from the blue-light-emitting layer 8 and the green-light-emitting layer 10 with good balance. On the other hand, when the thickness of the second interlayer 9 exceeds the upper limit, the driving voltage of the light-emitting element 1 tends to increase.

Green-light-emitting Layer

The green-light-emitting layer (third light-emitting layer) 10 contains a green-light-emitting material that emits green (third color) light. Examples of the green-light-emitting material include, but are not particularly limited to, various types of green fluorescent materials and green phosphorescent materials. These materials may be used alone or in combinations of two or more materials.

The green fluorescent materials are not particularly limited as long as the materials emit green fluorescence. Examples thereof include coumarin derivatives, quinacridone derivatives, 9,10-bis[(9-ethyl-3-carbazole)-vinylenyl]-anthracene, poly(9,9-dihexyl-2,7-vinylenefluorenylene), poly[(9,9-dioctylfluorene-2,7-diyl)-co-(1,4-diphenylene-vinylene-2-methoxy-5-{2-ethylhexyloxy}benzene)], and poly[(9,9-dioctyl-2,7-divinylenefluorenylene)-ortho-co-2-methoxy-5-(2-ethoxyhexyloxy)-1,4-phenylene)]. These materials may be used alone or in combinations of two or more materials.

The green phosphorescent materials are not particularly limited as long as the materials emit green phosphorescence. Examples of the green phosphorescent material include complexes of a metal such as iridium, ruthenium, platinum, osmium, rhenium, or palladium. Among these, compounds in which at least one ligand of the above metal complexes has a phenylpyridine skeleton, a bipyridyl skeleton, a porphyrin skeleton, or the like. More specifically, examples thereof include fac-tris(2-phenylpyridine)iridium ($Ir(ppy)_3$), bis(2-phenylpyridinate-N,C2')iridium(acetylacetonate), and fac-tris[5-fluoro-2-(5-trifluoromethyl-2-pyridine)phenyl-C,N] iridium.

As the material constituting the green-light-emitting layer 10, a host material can be used in combination with the above-mentioned green-light-emitting material functioning as a guest material as in the red-light-emitting layer 6 described above. When the above-mentioned green-light-emitting material (guest material) and a host material are used, the amount of green-light-emitting material (the amount of doping) contained in the green-light-emitting layer 10 is preferably in the range of 0.01 to 10 weight percent, and more preferably, in the range of 0.1 to 5 weight percent. By controlling the content of the green-light-emitting material within this range, light can be emitted from the green-light-emitting layer 10 while the amount of light emitted from the green-light-emitting layer 10 is balanced with the amounts of light emitted from the red-light-emitting layer 6 and the blue-light-emitting layer 8 described above.

Electron Transport Layer

The electron transport layer 11 has a function of transporting an electron injected from the cathode 13 through the electron injection layer 12. In this embodiment, the electron transport layer 11 transports an electron injected from the cathode 13 through the electron injection layer 12 to the green-light-emitting layer 10. Examples of the material (electron transport material) constituting the electron transport layer 11 include quinoline derivatives such as organometallic complexes having 8-quinolinol or a derivative thereof as a ligand, e.g., tris(8-quinolinolato)aluminum ($Alq_3$), oxadiazole derivatives, perylene derivatives, pyridine derivatives, pyrimidine derivatives, quinoxaline derivatives, diphenylquinone derivatives, nitro-substituted fluorene derivatives. These materials may be used alone or in combinations of two or more materials. The average thickness of the electron transport layer 11 is not particularly limited, but is preferably in the range of about 0.1 to 1,000 nm, more preferably, in the range of about 0.5 to 100 nm, and further preferably in the range of 1 to 50 nm.

Electron Injection Layer

The electron injection layer 12 has a function of improving electron injection efficiency from the cathode 13. Examples of the material (electron injection material) constituting the electron injection layer 12 include various types of inorganic insulating materials and inorganic semiconductor materials.

Examples of the inorganic insulating material include alkali metal chalcogenides (oxides, sulfides, selenides, and tellurides), alkaline earth metal chalcogenides, alkali metal halides, and alkaline earth metal halides. These materials may be used alone or in combinations of two or more materials. By using these materials as a main material of the electron injection layer 12, an electron-injecting property can be further improved. In particular, alkali metal compounds (such as alkali metal chalcogenides and alkali metal halides) have a very small work function. By forming the electron injection layer 12 using an alkali metal compound, the light-emitting element 1 can achieve a high luminance.

Examples of the alkali metal chalcogenides include $Li_2O$, LiO, $Na_2S$, $Na_2Se$, and NaO. Examples of alkaline earth metal chalcogenide include Cao, BaO, SrO, BeO, BaS, MgO, and CaSe. Examples of the alkali metal halide include CsF, LiF, NaF, KF, LiCl, KCl, and NaCl. Examples of the alkaline earth metal halide include $CaF_2$, $BaF_2$, $SrF_2$, $MgF_2$, and $BeF_2$.

Examples of the inorganic semiconductor material include oxides, nitrides, and oxynitrides containing at least one element selected from Li, Na, Ba, Ca, Sr, Yb, Al, Ga, In, Cd, Mg, Si, Ta, Sb, and Zn. These materials may be used alone or in combinations of two or more materials. The average thickness of the electron injection layer 12 is not particularly limited, but is preferably in the range of about 0.1 to 1,000 nm, more preferably in the range of about 0.2 to 100 nm, and further preferably in the range of 0.2 to 50=m.

Sealing Member

The sealing member 15 is provided so as to cover the anode 3, the laminate 14, and the cathode 13, and has a function of air-tightly sealing these components to block oxygen and moisture. The formation of the sealing member 15 provides advantages of an improvement in reliability of the light-emitting element 1, prevention of a change in quality and degradation thereof (improvement in durability), and the like.

Examples of the material constituting the sealing member 15 include Al, Au, Cr, Nb, Ta, Ti, alloys containing these, silicon oxide, and various types of resins. When a conductive material is used as the material constituting the sealing member 15, an insulating film is preferably provided between the sealing member 15 and each of the anode 3, the laminate 14, and the cathode 13, as needed, in order to prevent short circuit. Alternatively, the sealing member 15 may be a flat plate facing the substrate 2, and areas between the sealing member 15 and the substrate 2 may be sealed with a sealing material, for example, a thermosetting resin.

The light-emitting element 1 having the above structure can be produced by, for example, as follows.

(1) First, a substrate 2 is prepared, and an anode 3 is formed on the substrate 2. The anode 3 can be formed by, for example, a dry plating method such as a chemical vapor deposition (CVD) method, e.g., a plasma CVD method or a thermal CVD method, or vacuum evaporation; a wet plating method such as electroplating; a thermal spraying method; a sol-gel method; a metal organic deposition (MOD) method; or a method of joining a metal foil.

(2) Next, a hole injection layer 4 is formed on the anode 3. The hole injection layer 4 can be formed by, for example, a vapor-phase process using a dry plating method such as a CVD method, vacuum evaporation, or sputtering. Alternatively, the hole injection layer 4 can be formed by, for example, supplying a material for forming a hole injection layer prepared by dissolving a hole injection material in a solvent or dispersing a hole injection material in a dispersion medium on the anode 3, and then drying (removing the solvent or removing the dispersion medium).

Various types of application methods such as a spin coating method, a roll coating method, or an ink jet printing method can be employed as the method of supplying the material for forming a hole injection layer. The hole injection layer 4 can be relatively easily formed by using such an application method. Examples of the solvent or the dispersion medium used for preparing the material for forming a hole injection layer include various types of inorganic solvents, organic solvents, and mixed solvents containing these solvents. The drying can be performed by, for example, leaving the resulting substrate 2 to stand under atmospheric pressure or a reduced pressure, performing a heat treatment, or blowing an inert gas.

Furthermore, prior to this step, an oxygen plasma treatment may be performed on the upper surface of the anode 3. Thereby, for example, lyophilicity can be provided on the upper surface of the anode 3, organic substances adhered to the upper surface of the anode 3 can be removed (cleaned), or the work function near the upper surface of the anode 3 can be adjusted. Regarding conditions for this oxygen plasma treatment, preferably, for example, the plasma power is in the range of about 100 to 800 W, the oxygen gas flow rate is in the range of about 50 to 100 mL/min., the transferring speed of the member to be treated (anode 3) is in the range of about 0.5 to 10 mm/sec, and the temperature of the substrate 2 is in the range of about 70° C. to 90° C.

(3) Next, a hole transport layer 5 is formed on the hole injection layer 4. The hole transport layer 5 can be formed by, for example, a vapor-phase process using a dry plating method such as CVD, vacuum evaporation, or sputtering. Alternatively, the hole transport layer 5 can be formed by supplying a material for forming a hole transport layer prepared by dissolving a hole transport material in a solvent or dispersing a hole transport material in a dispersion medium on the hole injection layer 4, and then drying (removing the solvent or removing the dispersion medium).

(4) Next, a red-light-emitting layer 6 is formed on the hole transport layer 5. The red-light-emitting layer 6 can be formed by, for example, a vapor-phase process using a dry plating method such as CVD, vacuum evaporation, or sputtering.

(5) Next, a first interlayer 7 is formed on the red-light-emitting layer 6. The first interlayer 7 can be formed by, for example, a vapor-phase process using a dry plating method such as CVD, vacuum evaporation, or sputtering.

(6) Next, a blue-light-emitting layer 8 is formed on the first interlayer 7. The blue-light-emitting layer 8 can be formed by, for example, a vapor-phase process using a dry plating method such as CVD, vacuum evaporation, or sputtering.

(7) Next, a second interlayer 9 is formed on the blue-light-emitting layer 8. The second interlayer 9 can be formed by, for example, a vapor-phase process using a dry plating method such as CVD, vacuum evaporation, or sputtering.

(8) Next, a green-light-emitting layer 10 is formed on the second interlayer 9. The green-light-emitting layer 10 can be formed by, for example, a vapor-phase process using a dry plating method such as CVD, vacuum evaporation, or sputtering.

(9) Next, an electron transport layer 11 is formed on the green-light-emitting layer 10. The electron transport layer 11 can be formed by, for example, a vapor-phase process using a dry plating method such as CVD, vacuum evaporation, or sputtering. Alternatively, the electron transport layer 11 can be formed by supplying a material for forming an electron transport layer prepared by dissolving an electron transport material in a solvent or dispersing an electron transport material in a dispersion medium on the green-light-emitting layer 10, and then drying (removing the solvent or removing the dispersion medium).

(10) Next, an electron injection layer 12 is formed on the electron transport layer 11. In the case where an inorganic material is used as the material constituting the electron injection layer 12, the electron injection layer 12 can be formed by, for example, a vapor-phase process using a dry plating method such as CVD, vacuum evaporation, or sputtering; or applying an inorganic fine particle ink and performing baking.

(11) Next, a cathode 13 is formed on the electron injection layer 12. The cathode 13 can be formed by, for example, vacuum evaporation, sputtering, joining a metal foil, or applying a metal fine particle ink and performing baking. The light-emitting element 1 can be produced by the above-described steps. Finally, the resulting light-emitting element 1 is covered with a sealing member 15, and the sealing member 15 is joined to the substrate 2.

According to the light-emitting element 1 described above, the first interlayer 7 having an excellent hole-transporting property and the second interlayer 9 having an excellent electron-transporting property are provided. Accordingly, a carrier recombination region can be provided to the light-emitting layers with good balance, and the dependency of the recombination on the current and voltage can be reduced. As a result, the light-emitting layers can emit light with good balance while realizing excellent durability and luminous efficiency. Accordingly, the light-emitting element 1 can emit white light with a very high purity.

Second Embodiment

Figure 3:
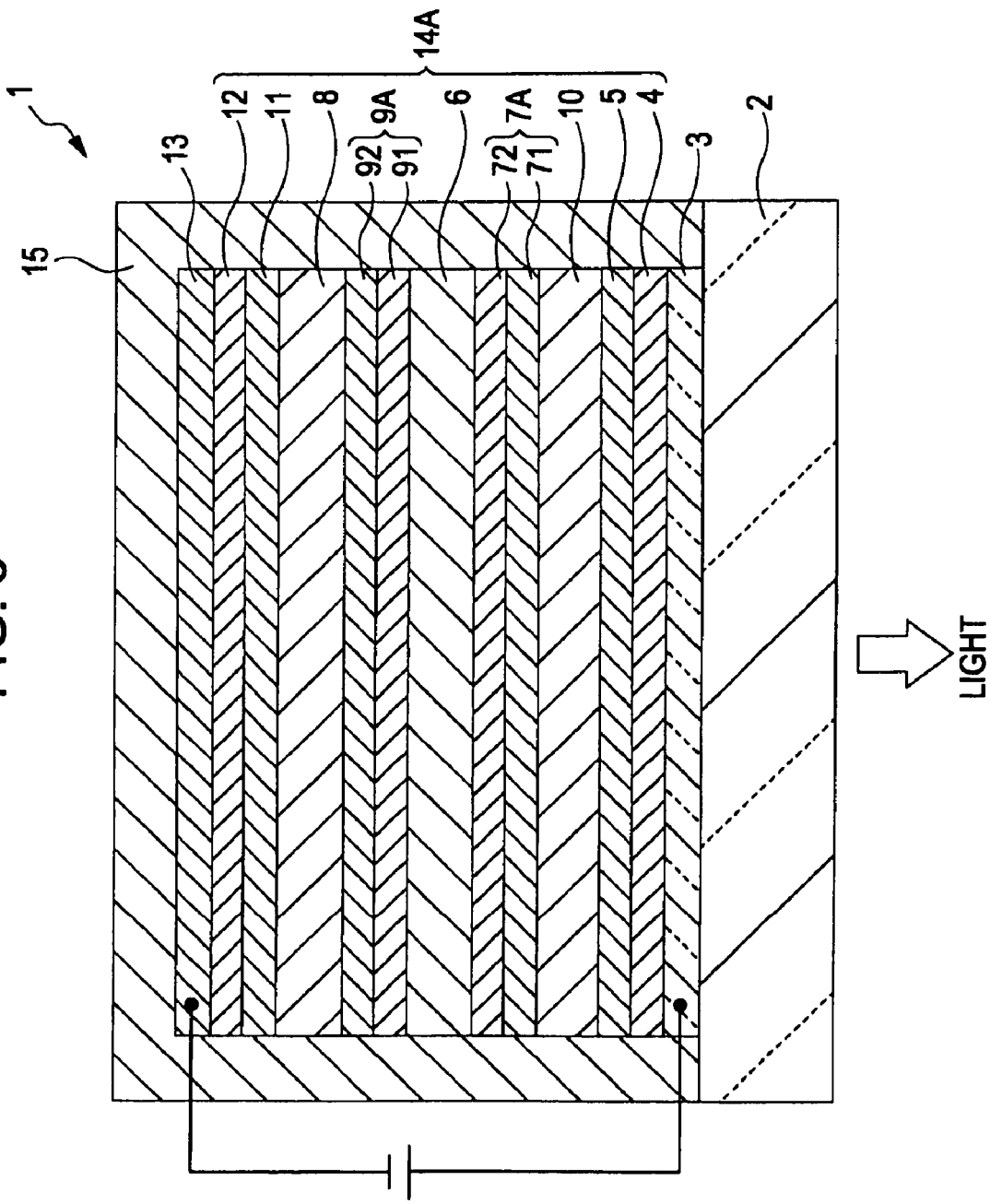
FIG. 3 is a schematic longitudinal cross-sectional view of a light-emitting element according to a second embodiment of the invention.
Figure 4:
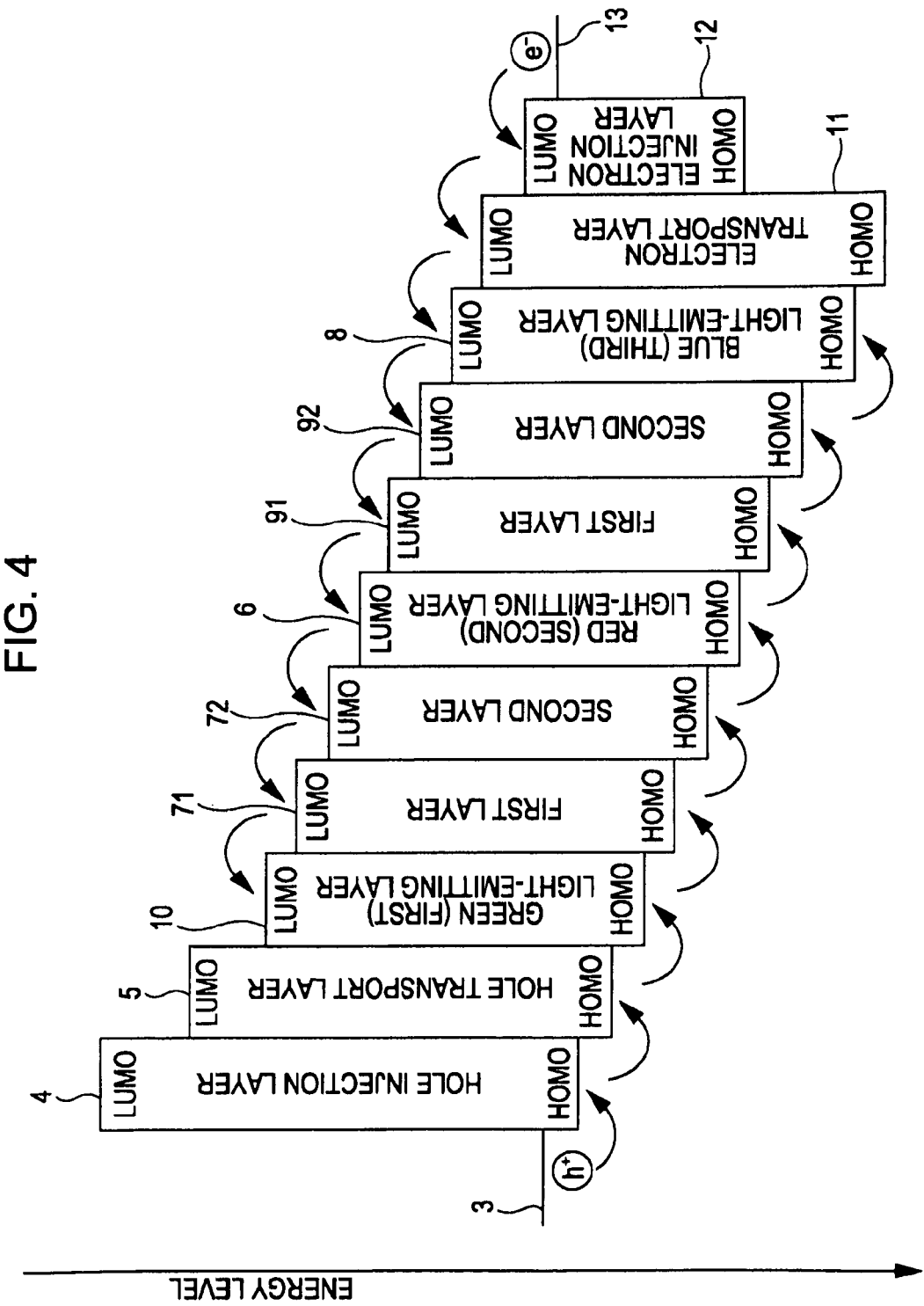
FIG. 4 is a drawing illustrating the energy level of each of layers of the light-emitting element shown in FIG. 3.

FIG. 3 is a schematic longitudinal cross-sectional view of a light-emitting element according to a second embodiment of the invention. FIG. 4 is a drawing illustrating the energy level of each of layers of the light-emitting element shown in FIG. 3. Note that, for the convenience of a description below, the upper side in FIG. 3 is defined as "top", and the lower side in FIG. 3 is defined as "bottom". A light-emitting element 1A of this embodiment is the same as the above-described light-emitting element 1 of the first embodiment except that the order of lamination of light-emitting layers is different, and each of a first interlayer and a second interlayer has a two-layer structure including a first layer and a second layer.

In the light-emitting element 1A of this embodiment, as shown in FIG. 3, a laminate 14A is interposed between an anode 3 and a cathode 13. In the laminate 14A, from the anode 3 side to the cathode 13 side, a hole injection layer 4, a hole transport layer 5, a green-light-emitting layer (first light-emitting layer) 10, a first interlayer 7A, a red-light-emitting layer (second light-emitting layer) 6, a second interlayer 9A, a blue-light-emitting layer (third light-emitting layer) 8, an electron transport layer 11, and an electron injection layer 12 are laminated in that order.

That is, in the light-emitting element 1A, the anode 3, the hole injection layer 4, the hole transport layer 5, the green-light-emitting layer 10, the first interlayer 7A, the red-light-emitting layer 6, the second interlayer 9A, the blue-light-emitting layer 8, the electron transport layer 11, the electron injection layer 12, and the cathode 13 are laminated in that order. In particular, the first interlayer 7A includes a first layer 71 provided so as to be in contact with the green-light-emitting layer 10 and a second layer 72 provided so as to be in contact with the red-light-emitting layer 6. The second interlayer 9A includes a first layer 91 provided so as to be in contact with the red-light-emitting layer 6 and a second layer 92 provided so as to be in contact with the blue-light-emitting layer 8. Each of the first interlayer 7A and the second interlayer 9A has a laminated structure (two-layer structure). Therefore, by adjusting the material and the thickness of each of the first layer and the second layer, the first interlayer 7A and second interlayer 9A having desired characteristics can be easily obtained.

In the light-emitting element 1A, as shown in FIG. 4, it is preferable that the energy level of each of the highest occupied molecular orbital (HOMO) and the lowest unoccupied molecular orbital (LUMO) of the material of each of the layers constituting the light-emitting element 1A become sequentially high from the anode 3 side to the cathode 13 side. By setting the highest occupied molecular orbital (HOMO) and the lowest unoccupied molecular orbital (LUMO) of the material of each of the layers constituting the light-emitting element 1A in this manner, the excellent injection balance of carriers in the layers can be realized while reducing the driving voltage of the light-emitting element 1A. Note that, in FIG. 4, the energy level becomes high from the upper side to the lower side as in FIG. 2. Accordingly, in FIG. 4, the amount of energy (electric potential [eV]) becomes small from the upper side to the lower side.

The highest occupied molecular orbital (HOMO) and the lowest unoccupied molecular orbital (LUMO) of the first interlayer 7A will be described in more detail with reference to FIG. 4. The energy level of the highest occupied molecular orbital of the material constituting the first layer 71 is higher than the energy level of the highest occupied molecular orbital of the material constituting the green-light-emitting layer (first light-emitting layer) 10. Consequently, the first layer 71 limits the amount of movement of holes from the green-light-emitting layer 10 to the red-light-emitting layer 6, and thus light can be emitted from the green-light-emitting layer 10 and the red-light-emitting layer 6 with good balance. In addition, the energy level of the highest occupied molecular orbital of the material constituting the second layer 72 is also higher than the energy level of the highest occupied molecular orbital of the material constituting the green-light-emitting layer (first light-emitting layer) 10. Consequently, the second layer 72 also limits the amount of movement of holes from the green-light-emitting layer 10 to the red-light-emitting layer 6, and thus light can be emitted from the green-light-emitting layer 10 and the red-light-emitting layer 6 with good balance.

In addition, each of the energy levels of the highest occupied molecular orbital of the materials constituting the first layer 71 and the second layer 72 lies between the energy level of the highest occupied molecular orbital of the material constituting the green-light-emitting layer 10 and the energy level of the highest occupied molecular orbital of the material constituting the red-light-emitting layer 6. Accordingly, by reducing the energy gap between the highest occupied molecular orbital of the material constituting the green-light-emitting layer 10 and the highest occupied molecular orbital of the material constituting the red-light-emitting layer 6 (by reducing the height of a barrier due to the energy gap), the driving voltage of the light-emitting element 1A can be reduced. In addition, the energy level of the highest occupied molecular orbital of the material constituting the second layer 72 is higher than the energy level of the highest occupied molecular orbital of the material constituting the first layer 71. Therefore, the energy gap between the highest occupied molecular orbital of the material constituting the green-light-emitting layer 10 and the highest occupied molecular orbital of the material constituting the red-light-emitting layer 6 can be effectively reduced.

In particular, when there is the relationship among the energy levels of the highest occupied molecular orbitals shown in FIG. 4, the difference between the energy level of the highest occupied molecular orbital of the material constituting the first layer 71 and the energy level of the highest occupied molecular orbital of each of the materials constituting the green-light-emitting layer 10 and the red-light-emitting layer 6 is preferably in the range of 0.1 to 0.4 eV. In this case, the driving voltage of the light-emitting element 1A can be reduced while achieving an excellent light-emission balance between the green-light-emitting layer 10 and the red-light-emitting layer 6.

Furthermore, the energy level of the lowest unoccupied molecular orbital of the material constituting the first layer 71 is lower than the energy level of the lowest unoccupied molecular orbital of the material constituting the red-light-emitting layer 6. Consequently, the first layer 71 limits the amount of movement of electrons from the red-light-emitting layer 6 to the green-light-emitting layer 10, and thus light can be emitted from the green-light-emitting layer 10 and the red-light-emitting layer 6 with good balance. In addition, the energy level of the lowest unoccupied molecular orbital of the material constituting the second layer 72 is also lower than the energy level of the lowest unoccupied molecular orbital of the material constituting the red-light-emitting layer 6. Consequently, the second layer 72 also limits the amount of movement of electrons from the red-light-emitting layer 6 to the green-light-emitting layer 10, and thus light can be emitted from the green-light-emitting layer 10 and the red-light-emitting layer 6 with good balance.

In addition, each of the energy levels of the lowest unoccupied molecular orbital of the materials constituting the first layer 71 and the second layer 72 lies between the energy level of the lowest unoccupied molecular orbital of the material constituting the green-light-emitting layer 10 and the energy level of the lowest unoccupied molecular orbital of the material constituting the red-light-emitting layer 6. Accordingly, by reducing the energy gap between the lowest unoccupied molecular orbital of the material constituting the green-light-emitting layer 10 and the lowest unoccupied molecular orbital of the material constituting the red-light-emitting layer 6 (by reducing the height of a barrier due to the energy gap), the driving voltage of the light-emitting element 1A can be reduced. In addition, the energy level of the lowest unoccupied molecular orbital of the material constituting the second layer 72 is higher than the energy level of the lowest unoccupied molecular orbital of the material constituting the first layer 71. Therefore, the energy gap between the lowest unoccupied molecular orbital of the material constituting the green-light-emitting layer 10 and the lowest unoccupied molecular orbital of the material constituting the red-light-emitting layer 6 can be effectively reduced.

In particular, when there is the relationship among the energy levels of the lowest unoccupied molecular orbitals shown in FIG. 4, the difference between the energy level of the lowest unoccupied molecular orbital of the material constituting the second layer 72 and the energy level of the lowest unoccupied molecular orbital of each of the materials constituting the green-light-emitting layer 10 and the red-light-emitting layer 6 is preferably in the range of 0.1 to 0.4 eV. In this case, the driving voltage of the light-emitting element 1A can be reduced while achieving an excellent light-emission balance between the green-light-emitting layer 10 and the red-light-emitting layer 6.

Furthermore, the energy gap (band-gap) between the lowest unoccupied molecular orbital and the highest occupied molecular orbital of the material constituting the first layer 71 is preferably larger than the energy gap (band-gap) between the lowest unoccupied molecular orbital and the highest occupied molecular orbital of the material constituting the green-light-emitting layer 10. This structure can prevent energy of an exciton generated in the green-light-emitting layer 10 from transferring to the first layer 71. As a result, light can be emitted from the green-light-emitting layer 10 and the red-light-emitting layer 6 with good balance.

In addition, the energy gap (band-gap) between the lowest unoccupied molecular orbital and the highest occupied molecular orbital of the material constituting the second layer 72 is preferably larger than the energy gap (band-gap) between the lowest unoccupied molecular orbital and the highest occupied molecular orbital of the material constituting the red-light-emitting layer 6. This structure can prevent energy of an exciton generated in the red-light-emitting layer 6 from transferring to the second layer 72. As a result, light can be emitted from the green-light-emitting layer 10 and the red-light-emitting layer 6 with good balance.

The first interlayer 7A has a hole-transporting property and an electron-transporting property. Accordingly, the first interlayer 7A can smoothly transfer holes and electrons between the green-light-emitting layer 10 and the red-light-emitting layer 6. In particular, the first interlayer 7A has a relatively high hole-transporting property. Specifically, the first interlayer 7A has a hole-transporting property higher than that of a second interlayer 9A described below. Accordingly, holes can be smoothly transferred from the green-light-emitting layer 10 to the red-light-emitting layer 6 through the first interlayer 7A. As the material constituting the first interlayer 7A, a material having a good carrier- (in particular, hole-) transporting property and a material having good carrier resistance are preferably used in combination. Consequently, excellent durability and luminous efficiency (current efficiency and driving voltage) can be achieved while realizing well-balanced light emission of the green-light-emitting layer 10 and light emission of the red-light-emitting layer 6 as described above.

From this point of view, in the first interlayer 7A, it is preferable that the first layer 71 contain the above-mentioned amine hole transport material as a main material, and the second layer 72 contain the above-mentioned acene bipolar material as a main material. Thereby, durability of the first interlayer 7A to carriers and excitons can be improved while realizing excellent carrier-transporting properties in the first interlayer 7A. As a result, light can be emitted from the green-light-emitting layer 10 and the red-light-emitting layer 6 with good balance while realizing excellent durability and luminous efficiency.

The content of the amine hole transport material in the first layer 71 is not particularly limited, but preferably in the range of 50 to 100 volume percent, more preferably in the range of 80 to 100 volume percent, and further preferably in the range of 90 to 100 volume percent. The content of the acene bipolar material in the second layer 72 is not particularly limited, but preferably in the range of 50 to 100 volume percent, more preferably in the range of 80 to 100 volume percent, and further preferably in the range of 90 to 100 volume percent.

The first layer 71 and the second layer 72 may contain materials other than the materials described above. The average thickness of each of the first layer 71 and the second layer 72 is preferably in the range of 1 to 50 nm, more preferably in the range of 3 to 30 nm, and further preferably in the range of 5 to 20 nm. Accordingly, light can be emitted from the red-light-emitting layer 6 and the green-light-emitting layer 10 with good balance while reducing the driving voltage of the light-emitting element 1A.

When the thickness of each of the first layer 71 and the second layer 72 is smaller than the above lower limit, it is difficult to realize excellent durability and current efficiency in some cases depending on, for example, the types of materials of the first layer 71 and the second layer 72 and the film qualities thereof. For some thicknesses of the first interlayer 7A and the like, the first interlayer 7A cannot satisfactorily prevent energy transfer of an exciton between the green-light-emitting layer 10 and the red-light-emitting layer 6, and thus it is difficult for light to be emitted from the green-light-emitting layer 10 and the red-light-emitting layer 6 with good balance. On the other hand, when the thickness of each of the first layer 71 and the second layer 72 exceeds the upper limit, the driving voltage of the light-emitting element 1A tends to increase. The average thickness of the whole first interlayer 7A is preferably 100 nm or less (in the range of 1 to 100 nm), more preferably in the range of 3 to 50 nm, and further preferably in the range of 5 to 30 nm. Accordingly, light can be emitted from the green-light-emitting layer 10 and the red-light-emitting layer 6 with good balance while reducing the driving voltage of the light-emitting element 1A.

The highest occupied molecular orbital (HOMO) and the lowest unoccupied molecular orbital (LUMO) of the second interlayer 9A will be described in more detail. The energy level of the highest occupied molecular orbital of the material constituting the first layer 91 is higher than the energy level of the highest occupied molecular orbital of the material constituting the red-light-emitting layer (second light-emitting layer) 6. Consequently, the first layer 91 limits the amount of movement of holes from the red-light-emitting layer 6 to the blue-light-emitting layer 8, and thus light can be emitted from the red-light-emitting layer 6 and the blue-light-emitting layer 8 with good balance. In addition, the energy level of the highest occupied molecular orbital of the material constituting the second layer 92 is also higher than the energy level of the highest occupied molecular orbital of the material constituting the red-light-emitting layer (second light-emitting layer) 6. Consequently, the second layer 92 also limits the amount of movement of holes from the red-light-emitting layer 6 to the blue-light-emitting layer 8, and thus light can be emitted from the red-light-emitting layer 6 and the blue-light-emitting layer 8 with good balance.

In addition, each of the energy levels of the highest occupied molecular orbital of the materials constituting the first layer 91 and the second layer 92 lies between the energy level of the highest occupied molecular orbital of the material constituting the red-light-emitting layer 6 and the energy level of the highest occupied molecular orbital of the material constituting the blue-light-emitting layer 8. Accordingly, by reducing the energy gap between the highest occupied molecular orbital of the material constituting the red-light-emitting layer 6 and the highest occupied molecular orbital of the material constituting the blue-light-emitting layer 8 (by reducing the height of a barrier due to the energy gap), the driving voltage of the light-emitting element 1A can be reduced. In addition, the energy level of the highest occupied molecular orbital of the material constituting the second layer 92 is higher than the energy level of the highest occupied molecular orbital of the material constituting the first layer 91. Therefore, the energy gap between the highest occupied molecular orbital of the material constituting the red-light-emitting layer 6 and the highest occupied molecular orbital of the material constituting the blue-light-emitting layer 8 can be effectively reduced.

In particular, when there is the relationship among the energy levels of the highest occupied molecular orbitals shown in FIG. 4, the difference between the energy level of the highest occupied molecular orbital of the material constituting the first layer 91 and the energy level of the highest occupied molecular orbital of each of the materials constituting the red-light-emitting layer 6 and the blue-light-emitting layer 8 is preferably in the range of 0.1 to 0.4 eV. In this case, the driving voltage of the light-emitting element 1A can be reduced while achieving an excellent light-emission balance between the red-light-emitting layer 6 and the blue-light-emitting layer 8.

Furthermore, the energy level of the lowest unoccupied molecular orbital of the material constituting the first layer 91 is lower than the energy level of the lowest unoccupied molecular orbital of the material constituting the blue-light-emitting layer 8. Consequently, the first layer 91 limits the amount of movement of electrons from the blue-light-emitting layer 8 to the red-light-emitting layer 6, and thus light can be emitted from the red-light-emitting layer 6 and the blue-light-emitting layer 8 with good balance. In addition, the energy level of the lowest unoccupied molecular orbital of the material constituting the second layer 92 is also lower than the energy level of the lowest unoccupied molecular orbital of the material constituting the blue-light-emitting layer 8. Consequently, the second layer 92 also limits the amount of movement of electrons from the blue-light-emitting layer 8 to the red-light-emitting layer 6, and thus light can be emitted from the red-light-emitting layer 6 and the blue-light-emitting layer 8 with good balance.

In addition, each of the energy levels of the lowest unoccupied molecular orbital of the materials constituting the first layer 91 and the second layer 92 lies between the energy level of the lowest unoccupied molecular orbital of the material constituting the red-light-emitting layer 6 and the energy level of the lowest unoccupied molecular orbital of the material constituting the blue-light-emitting layer 8. Accordingly, by reducing the energy gap between the lowest unoccupied molecular orbital of the material constituting the red-light-emitting layer 6 and the lowest unoccupied molecular orbital of the material constituting the blue-light-emitting layer 8 (by reducing the height of a barrier due to the energy gap), the driving voltage of the light-emitting element 1A can be reduced. In addition, the energy level of the lowest unoccupied molecular orbital of the material constituting the second layer 92 is higher than the energy level of the lowest unoccupied molecular orbital of the material constituting the first layer 91. Therefore, the energy gap between the lowest unoccupied molecular orbital of the material constituting the red-light-emitting layer 6 and the lowest unoccupied molecular orbital of the material constituting the blue-light-emitting layer 8 can be effectively reduced.

In particular, when there is the relationship among the energy levels of the lowest unoccupied molecular orbitals shown in FIG. 4, the difference between the energy level of the lowest unoccupied molecular orbital of the material constituting the second layer 92 and the energy level of the lowest unoccupied molecular orbital of each of the materials constituting the red-light-emitting layer 6 and the blue-light-emitting layer 8 is preferably in the range of 0.1 to 0.4 eV. In this case, the driving voltage of the light-emitting element 1A can be reduced while achieving an excellent light emission balance between the red-light-emitting layer 6 and the blue-light-emitting layer 8.

Furthermore, the energy gap (band-gap) between the lowest unoccupied molecular orbital and the highest occupied molecular orbital of the material constituting the first layer 91 is preferably larger than the energy gap (band-gap) between the lowest unoccupied molecular orbital and the highest occupied molecular orbital of the material constituting the red-light-emitting layer 6. This structure can prevent energy of an exciton generated in the red-light-emitting layer 6 from transferring to the first layer 91. As a result, light can be emitted from the red-light-emitting layer 6 and the blue-light-emitting layer 8 with good balance.

In addition, the energy gap (band-gap) between the lowest unoccupied molecular orbital and the highest occupied molecular orbital of the material constituting the second layer 92 is preferably larger than the energy gap (band-gap) between the lowest unoccupied molecular orbital and the highest occupied molecular orbital of the material constituting the blue-light-emitting layer 8. This structure can prevent energy of an exciton generated in the blue-light-emitting layer 8 from transferring to the second layer 92. As a result, light can be emitted from the green-red-light-emitting layer 6 and the blue-light-emitting layer 8 with good balance.

The second interlayer 9A has a hole-transporting property and an electron-transporting property. Accordingly, the second interlayer 9A can smoothly transfer holes and electrons between the red-light-emitting layer 6 and the blue-light-emitting layer 8. In particular, the second interlayer 9A has a relatively high electron-transporting property. Specifically, the second interlayer 9A has an electron-transporting property higher than that of the first interlayer 7A described above. Accordingly, electrons can be smoothly transferred from the blue-light-emitting layer 8 to the red-light-emitting layer 6 through the second interlayer 9A.

As the material constituting the second interlayer 9A, a material having a good carrier- (electron- and/or hole-) transporting property and a material having good carrier resistance are preferably used in combination. Consequently, excellent durability and luminous efficiency (current efficiency and driving voltage) can be achieved while realizing well-balanced light emission of the red-light-emitting layer 6 and light emission of the blue-light-emitting layer 8 as described above.

From this point of view, in the second interlayer 9A, it is preferable that the first layer 91 contain the above-mentioned acene bipolar material as a main material, and the second layer 92 contain the above-mentioned silole electron transport material as a main material. Thereby, durability of the second interlayer 9A to carriers and excitons can be improved while realizing excellent carrier-transporting properties in the second interlayer 9A. As a result, light can be emitted from the red-light-emitting layer 6 and the blue-light-emitting layer 8 with good balance while realizing excellent durability and luminous efficiency.

The content of the acene bipolar material in the second layer 91 is not particularly limited, but preferably in the range of 50 to 100 volume percent, more preferably in the range of 80 to 100 volume percent, and further preferably in the range of 90 to 100 volume percent. The content of the silole electron transport material in the second layer 92 is not particularly limited, but preferably in the range of 50 to 100 volume percent, more preferably in the range of 80 to 100 volume percent, and further preferably in the range of 90 to 100 volume percent.

The first layer 91 and the second layer 92 may contain materials other than the materials described above. The average thickness of each of the first layer 91 and the second layer 92 is preferably in the range of 1 to 50 nm, more preferably in the range of 3 to 30 nm, and further preferably in the range of 5 to 20 nm. Accordingly, light can be emitted from the blue-light-emitting layer 8 and the red-light-emitting layer 6 with good balance while reducing the driving voltage of the light-emitting element 1A.

When the thickness of each of the first layer 91 and the second layer 92 is smaller than the above lower limit, it is difficult to realize excellent durability and current efficiency in some cases depending on, for example, the types of materials of the first layer 91 and the second layer 92 and the film qualities thereof. For some thicknesses of the second interlayer 9A and the like, the second interlayer 9A cannot satisfactorily prevent energy transfer of an exciton between the red-light-emitting layer 6 and the blue-light-emitting layer 8, and thus it is difficult for light to be emitted from the red-light-emitting layer 6 and the blue-light-emitting layer 8 with good balance. On the other hand, when the thickness of each of the first layer 91 and the second layer 92 exceeds the upper limit, the driving voltage of the light-emitting element 1A tends to increase.

The average thickness of the whole second interlayer 9A is preferably 100 nm or less (in the range of 1 to 100 nm), more preferably in the range of 3 to 50 nm, and further preferably in the range of 5 to 30 nm. Accordingly, light can be emitted from the red-light-emitting layer 6 and the blue-light-emitting layer 8 with good balance while reducing the driving voltage of the light-emitting element 1A. Furthermore, in the case where the red-light-emitting layer 6 is provided at the central portion as in this embodiment, it is preferable that the thickness of the red-light-emitting layer (second light-emitting layer) 6 be smaller than the thicknesses of other light-emitting layers (the first light-emitting layer and the third light-emitting layer). Red light-emitting materials have a small band-gap, and thus easily emit light. Therefore, by controlling the thickness of the red-light-emitting layer 6 to be smaller than the thicknesses of the other light-emitting layers, the amount of light emitted from the red-light-emitting layer 6 is moderately reduced, and the light-emission balance among the light-emitting layers can be optimized.

The light-emitting element 1A described above can also achieve the same advantages as the above-described light-emitting element 1 of the first embodiment. In particular, by forming the first interlayer 7A and the second interlayer 9A each having a laminated structure (two-layer structure) and adjusting the material and the thickness of each of the layers constituting the laminated structure, the first interlayer 7A and second interlayer 9A having desired characteristics can be easily obtained.

The light-emitting elements 1 and 1A described above can be used as a light source or the like. Alternatively, by arranging a plurality of light-emitting elements 1 or the like in a matrix, a display apparatus (display device of the invention) can be formed. Accordingly, a display device and electronic apparatus having excellent reliability can be provided. The driving method of the display apparatus is not particularly limited, and may be either an active matrix method or a passive matrix method.

Figure 5:
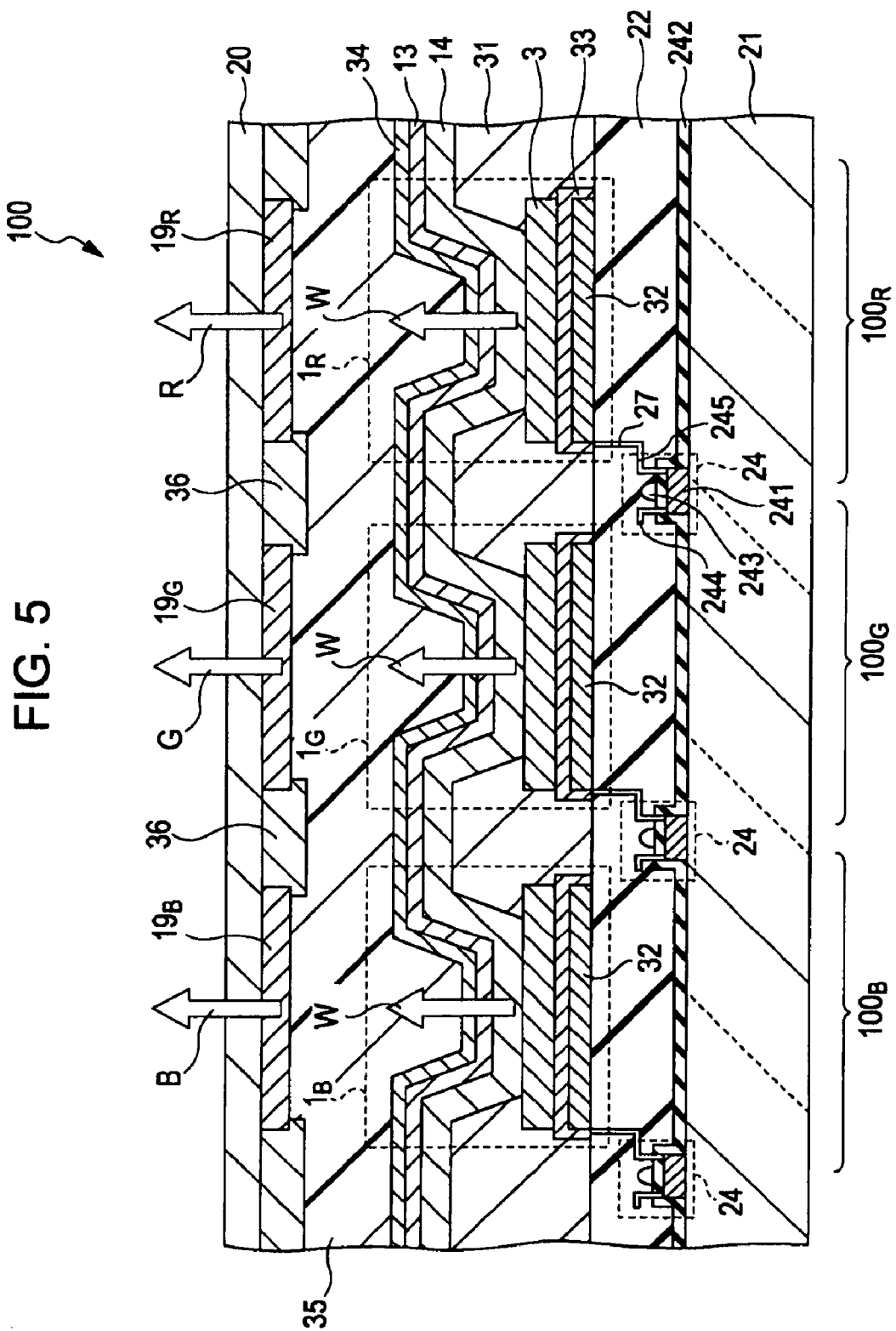
FIG. 5 is a longitudinal cross-sectional view showing an embodiment of a display apparatus to which a display device of the invention is applied.

Next, a description will be made of an example of a display apparatus to which a display device of the invention is applied. FIG. 5 is a longitudinal cross-sectional view showing an embodiment of a display apparatus to which a display device of the invention is applied. A display apparatus 100 shown in FIG. 5 includes a substrate 21, a plurality of light-emitting elements $1_R$, $1_G$, and $1_B$ and color filters $19_R$, $19_G$, and $19_B$ provided so as to correspond to subpixels $100_R$, $100_G$, and $100_B$, respectively, and a plurality of driving transistors 24 for driving the light-emitting elements $1_R$, $1_G$, and $1_B$. The display apparatus 100 is a display panel having a top-emission structure.

The driving transistors 24 are provided on the substrate 21. A planarizing layer 22 made of an insulating material is provided so as to cover the driving transistors 24. Each of the driving transistors 24 includes a semiconductor layer 241 made of silicon, a gate insulating layer 242 provided on the semiconductor layer 241, a gate electrode 243 provided on the gate insulating layer 242, a source electrode 244, and a drain electrode 245.

The light-emitting elements $1_R$, $1_G$, and $1_B$ are provided on the planarizing layer 22 so as to correspond to the driving transistors 24. In the light-emitting element $1_R$, a reflective film 32, a corrosion-preventing film 33, an anode 3, a laminate (organic EL light-emitting portion) 14, a cathode 13, and a cathode cover 34 are laminated on the planarizing layer 22 in that order. In this embodiment, the anode 3 of each of the light-emitting elements $1_R$, $1_G$, and $1_B$ constitutes a pixel electrode and electrically connected to the corresponding drain electrode 245 of the driving transistor 24 via a conducting portion (wiring) 27. The cathode 13 of each of the light-emitting elements $1_R$, $1_G$, and $1_B$ forms a common electrode.

The structure of the light-emitting elements $1_G$ and $1_B$ is the same as that of the light-emitting element $1_R$. In FIG. 5, the same structures as those in FIG. 1 are assigned the same reference numerals. The structures (characteristics) of the reflective films 32 of the light-emitting elements $1_R$, $1_G$, and $1_B$ may be different from each other depending on the wavelength of light. A partition wall 31 is provided between the adjacent light-emitting elements $1_R$, $1_G$, and $1_B$. An epoxy layer 35 made of an epoxy resin is provided so as to cover the light-emitting elements $1_R$, $1_G$, and $1_B$.

The color filters $19_R$, $19_G$, and $19_B$ are provided on the epoxy layer 35 so as to correspond to the light-emitting elements $1_R$, $1_G$, and $1_B$. The color filters $19_R$ converts white light W emitted from the light-emitting element $1_R$ to red light. The color filters $19_G$ converts white light W emitted from the light-emitting element $1_G$ to green light. The color filters $19_B$ converts white light W emitted from the light-emitting element $1_B$ to blue light. By using the color filters $19_R$, $19_G$, and $19_B$ in combination with the light-emitting elements $1_R$, $1_G$, and $1_B$, a full-color image can be displayed.

A light-shielding layer 36 is provided between the adjacent color filters $19_R$, $19_G$, and $19_B$. This structure can prevent unintended subpixels $100_R$, $100_G$, and $100_B$ from emitting light. A sealing substrate 20 is provided on the color filters $19_R$, $19_G$, and $19_B$ and the light-shielding layer 36 so as to cover the color filters $19_R$, $19_G$, and $19_B$ and the light-shielding layer 36. The display apparatus 100 described above can display full-color images. Alternatively, the display apparatus 100 may have a structure that displays monochromatic images. The display apparatus 100 (display device of the invention) having the above structure can be incorporated in various types of electronic apparatuses.

Figure 6:
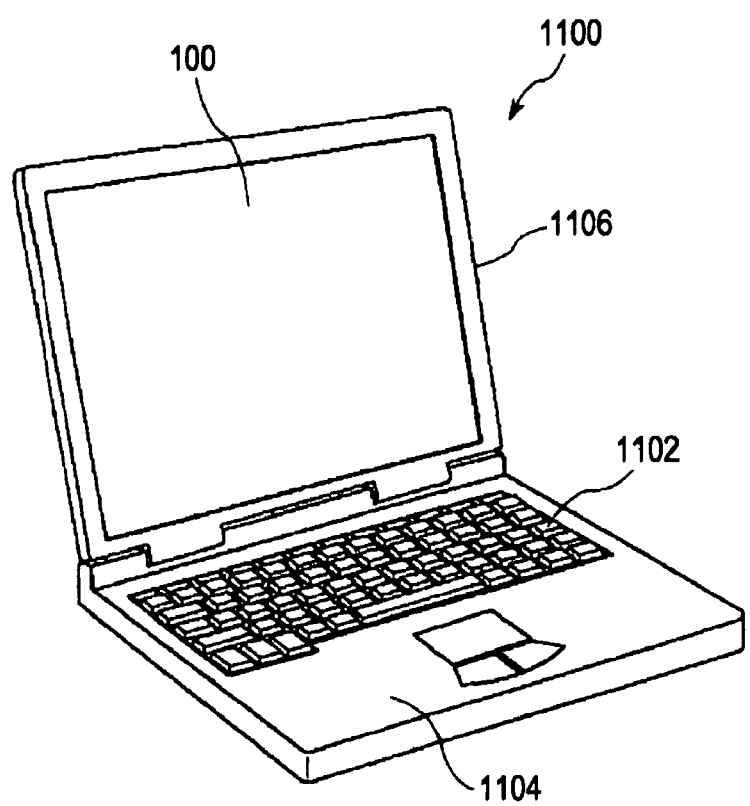
FIG. 6 is a perspective view showing the structure of a mobile (or notebook) personal computer to which an electronic apparatus of the invention is applied.

FIG. 6 is a perspective view showing the structure of a mobile (or notebook) personal computer to which an electronic apparatus of the invention is applied. In FIG. 6, a personal computer 1100 includes a body portion 1104 including a keyboard 1102 and a display unit 1106 including a display portion. The display unit 1106 is rotatably supported to the body portion 1104 with a hinge structure portion therebetween. In this personal computer 1100, the display portion of the display unit 1106 is composed of the display apparatus 100 described above.

Figure 7:
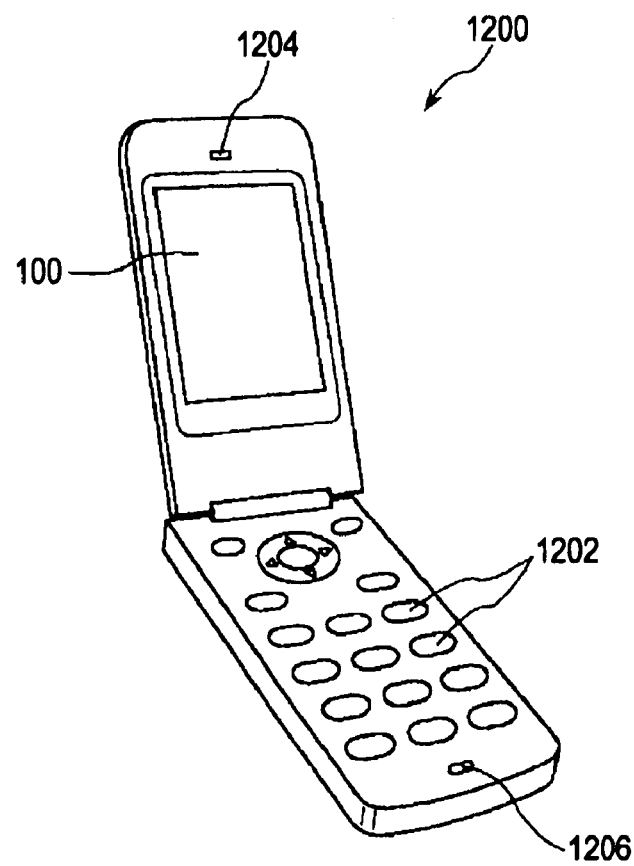
FIG. 7 is a perspective view showing the structure of a mobile phone (including a personal handyphone system (PHS)) to which an electronic apparatus of the invention is applied.

FIG. 7 is a perspective view showing the structure of a mobile phone (including a PHS) to which an electronic apparatus of the invention is applied. In FIG. 7, a mobile phone 1200 includes a plurality of operation buttons 1202, an earpiece 1204, a mouthpiece 1206, and a display portion. In the mobile phone 1200, the display portion is composed of the display apparatus 100 described above.

Figure 8:
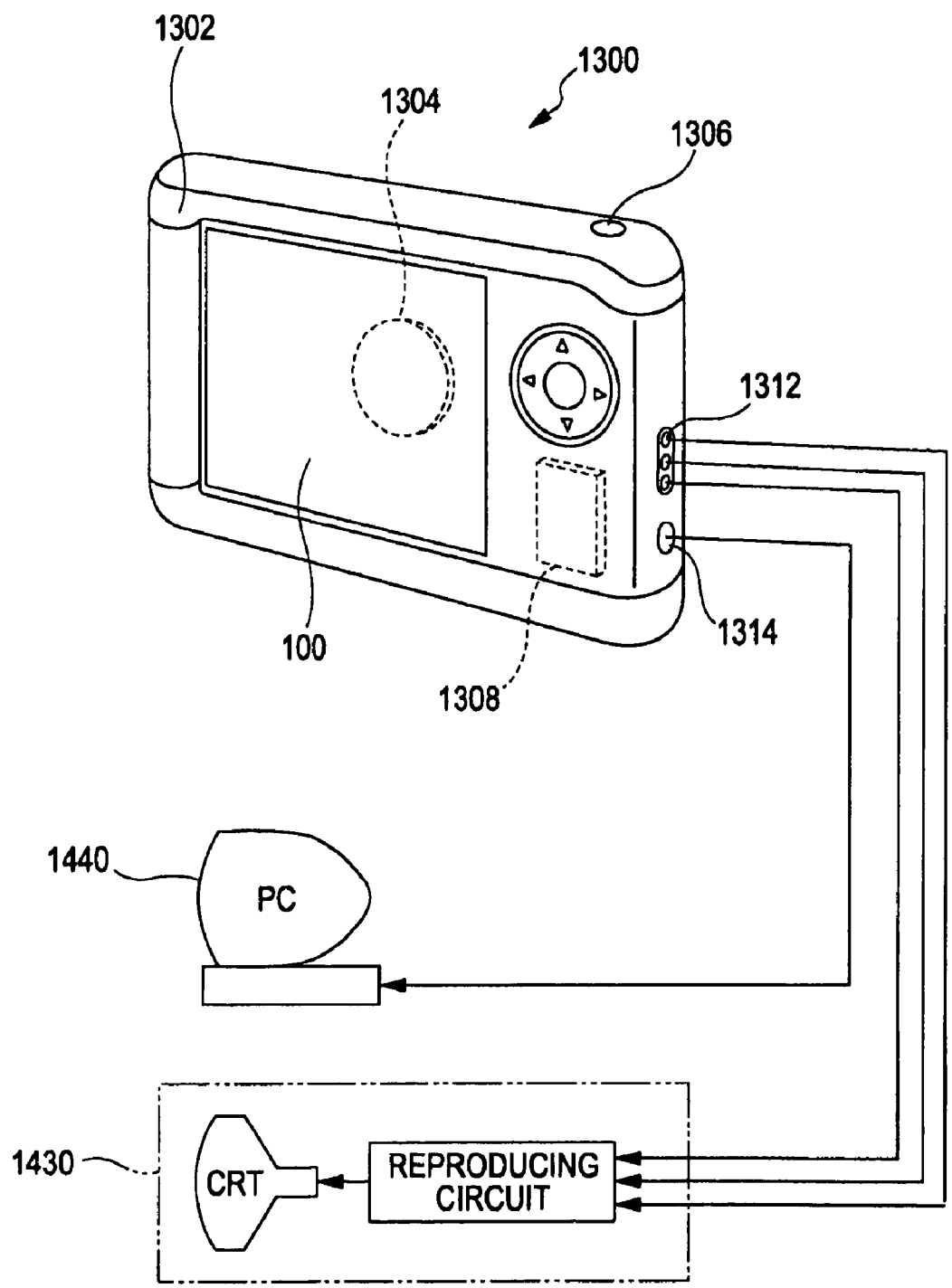
FIG. 8 is a perspective view showing the structure of a digital still camera to which an electronic apparatus of the invention is applied.

FIG. 8 is a perspective view showing the structure of a digital still camera to which an electronic apparatus of the invention is applied. Connections with external devices are also simply shown in this figure. In a film camera, a silver-salt photographic film is exposed to an optical image of an object, whereas, in a digital still camera 1300, an optical image of an object is photoelectrically converted with an image-pickup device such as a charge coupled device (CCD) to generate image-pickup signals (image signals).

A display portion is provided on the back surface of a case (body) 1302 of the digital still camera 1300, and is configured to perform display on the basis of image-pickup signals obtained by the CCD. The display portion functions as a finder that displays an object as an electronic image. In the digital still camera 1300, this display portion is composed of the display apparatus 100 described above.

A circuit board 1308 is provided inside the case 1302. This circuit board 1308 includes a memory that can store (memory) the image-pickup signals. Furthermore, a light-receiving unit 1304 including an optical lens (image-pickup optical system), the CCD, and the like is provided on the front side (on the back side in the structure shown in the figure) of the case 1302. When a user confirms an image of an object displayed on the display portion and pushes a shutter button 1306, image-pickup signals of the CCD at that time are transferred and stored in the memory of the circuit board 1308.

Furthermore, in the digital still camera 1300, video signal output terminals 1312 and a data-communication input/output terminal 1314 are provided on a side surface of the case 1302. As shown in FIG. 8, a television monitor 1430 is connected to the video signal output terminals 1312, and a personal computer 1440 is connected to the data-communication input/output terminal 1314 according to need. Furthermore, the image-pickup signals stored in the memory of the circuit board 1308 are output to the television monitor 1430 or the personal computer 1440 in accordance with a predetermined operation.

In addition to the personal computer (mobile personal computer) shown in FIG. 6, the mobile phone shown in FIG. 7, and the digital still camera shown in FIG. 8, examples of applications of the electronic apparatus of the invention include a television, a video camera, viewfinder-type and direct-monitoring-type video tape recorders, a laptop personal computer, a car navigation system, a pager, an electronic notebook (including an electronic notebook having a communication function), an electronic dictionary, an electronic calculator, an electronic game device, a word processor, a workstation, a video telephone, a security television monitor, electronic binoculars, a POS terminal, and devices with a touch panel (e.g., a cash dispenser in a financial institution and an automatic ticket vending machine), medical instruments (e.g., an electronic thermometer, a blood pressure gauge, a blood sugar meter, an electrocardiogram display device, an ultrasonic diagnostic device, and a display device for an endoscope), a fish detector, various types of measuring apparatuses and measuring gauges (e.g., measuring gauges of vehicles, aircraft, and vessels), a flight simulator, various types of monitors, and a projection display device such as a projector.

Light-emitting elements, a display device, and electronic apparatuses of the invention have been described on the basis of the embodiments shown in the drawings, but the invention is not limited to the above embodiments. In a light-emitting element of the invention, the structure of each portion can be replaced with any structure that can achieve a similar function, and any structure can be added. In addition, for example, a light-emitting element of the invention may be formed by combining any two or more of the structures of the first embodiment and the second embodiment described above. For example, in the first embodiment, at least one of the first interlayer and the second interlayer may be composed of two layers (may have a laminated structure). Alternatively, in the second embodiment, at least one of the first interlayer and the second interlayer may be composed of a single layer.

In the above embodiments, a light-emitting element including three light-emitting layers has been described. Alternatively, the light-emitting element may include four or more light-emitting layers. Alternatively, the light-emitting element may include a plurality of light-emitting layers with the same color. Alternatively, the light-emitting element may include a light-emitting layer with a color other than R, G, or B. In addition, the lamination order of the red-light-emitting layer 6, the blue-light-emitting layer 8, and the green-light-emitting layer 10 is not limited to that of the above embodiments as long as each of the first interlayer and the second interlayer can exert the function described above. In the description of the above embodiments, each of the first interlayer and the second interlayer is composed of one layer or two layers. Alternatively, each of the interlayers may be composed of three or more layers.

EXAMPLES

Next, Examples of the invention will be described.

1. Production of Light-emitting Elements

Example 1

(1) First, a transparent glass substrate having an average thickness of 0.5 mm was prepared. Next, an ITO electrode (anode) having an average thickness of 100 nm was formed on the substrate by sputtering. The substrate is then immersed in ethanol to perform ultrasonic cleaning. Subsequently, an oxygen plasma treatment was performed.

(2) Next, CuPc was deposited by vacuum evaporation on the ITO electrode to form a hole injection layer having an average thickness of 20 nm.

(3) Next, the above-mentioned amine hole transport material ($\alpha$-NPD) represented by Chemical Formula 1 was deposited on the hole injection layer by vacuum evaporation to form a hole transport layer having an average thickness of 40 nm.

(4) Next, a material of a green-light-emitting layer was deposited on the hole transport layer by vacuum evaporation to form the green-light-emitting layer (first light-emitting layer) having an average thickness of 10 nm. Regarding the material of the green-light-emitting layer, GD206 (manufactured by Idemitsu Kosan Co., Ltd.) was used as a green-light-emitting material (guest material) and BH215 (manufactured by Idemitsu Kosan Co., Ltd.) was used as a host material. The content (doping concentration) of the green-light-emitting material (dopant) in the green-light-emitting layer was 8.0 weight percent.

(5) Next, a material of a first interlayer was deposited on the green-light-emitting layer by vacuum evaporation to form the first interlayer having an average thickness of 10 nm. As the material of the first interlayer, the above-mentioned amine hole transport material ($\alpha$-NPD) represented by Chemical Formula 1 was used.

(6) Next, a material of a red-light-emitting layer was deposited on the first interlayer by vacuum evaporation to form the red-light-emitting layer (second light-emitting layer) having an average thickness of 10 nm. Regarding the material of the red-light-emitting layer, RD001 (manufactured by Idemitsu Kosan Co., Ltd.) was used as a red-light-emitting material (guest material) and BH215 (manufactured by Idemitsu Kosan Co., Ltd.) was used as a host material. The content (doping concentration) of the red-light-emitting material (dopant) in the red-light-emitting layer was 1.0 weight percent.

(7) Next, a material of a second interlayer was deposited on the red-light-emitting layer by vacuum evaporation to form the second interlayer having an average thickness of 10 nm. As the material of the second interlayer, a silole electron transport material (ET4 manufactured by Chisso Corporation) was used.

(8) Next, a material of a blue-light-emitting layer was deposited on the second interlayer by vacuum evaporation to form the blue-light-emitting layer (third light-emitting layer) having an average thickness of 10 nm. Regarding the material of the blue-light-emitting layer, BD102 (manufactured by Idemitsu Kosan Co., Ltd.) was used as a blue-light-emitting material (guest material) and BH215 (manufactured by Idemitsu Kosan Co., Ltd.) was used as a host material. The content (doping concentration) of the blue-light-emitting material (dopant) in the blue-light-emitting layer was 5.0 weight percent.

(9) Next, tris(8-quinolinolato)aluminum ($Alq_3$) was deposited on the blue-light-emitting layer by vacuum evaporation to form an electron transport layer having an average thickness of 20 nm.

(10) Next, lithium fluoride (LiF) was deposited on the electron transport layer by vacuum evaporation to form an electron injection layer having an average thickness of 1 nm.

(11) Next, aluminum (Al) was deposited on the electron injection layer by vacuum evaporation. A cathode made of Al and having an average thickness of 150 nm was formed.

(12) Next, a glass protective cover (sealing member) was disposed so as to cover the layers thus formed. The protective cover was fixed and sealed with an epoxy resin. A light-emitting element was produced by the above-described steps.

Here, the energy level of the HOMO of the material of the first interlayer was higher than the energy level of the HOMO of the material (host material) of the green-light-emitting layer, and the difference between the energy levels was 0.2 eV. The energy level of the HOMO of the material of the first interlayer was lower than the energy level of the HOMO of the material (host material) of the red-light-emitting layer, and the difference between the energy levels was 0.2 eV. The energy level of the LUMO of the material of the first interlayer was lower than the energy level of the LUMO of the material (host material) of the red-light-emitting layer, and the difference between the energy levels was 0.2 eV.

In addition, the energy level of the LUMO of the material of the second interlayer was lower than the energy level of the LUMO of the material (host material) of the blue-light-emitting layer, and the difference between the energy levels was 0.2 eV. The energy level of the LUMO of the material of the second interlayer was higher than the energy level of the LUMO of the material (host material) of the red-light-emitting layer, and the difference between the energy levels was 0.2 eV. The energy level of the HOMO of the material of the second interlayer was higher than the energy level of the HOMO of the material (host material) of the red-light-emitting layer, and the difference between the energy levels was 0.2 eV.

Example 2

A light-emitting element was produced as in Example 1 except that materials constituting the first interlayer and the second interlayer and the thickness of the red-light-emitting layer (second light-emitting layer) were different from those in Example 1. The average thickness of the red-light-emitting layer was 5 nm. A mixture of the above-mentioned amine hole transport material (α-NPD) represented by Chemical Formula 1 and the above-mentioned acene bipolar material (TBADN) represented by Chemical Formula 4 was used as the material of the first interlayer. The mixing ratio of the amine hole transport material and the acene bipolar material was (amine hole transport material):(acene bipolar material)=50:50. A mixture of a silole electron transport material (ET4 manufactured by Chisso Corporation) and the above-mentioned acene bipolar material (TBADN) represented by Chemical Formula 4 was used as the material of the second interlayer. The mixing ratio of the silole electron transport material and the acene bipolar material was (silole electron transport material):(acene bipolar material)=50:50.

The energy level of the HOMO of the material (the material having the lower energy level of the HOMO among the above two types of materials) of the first interlayer was higher than the energy level of the HOMO of the material (host material) of the green-light-emitting layer, and the difference between the energy levels was 0.2 eV. The energy level of the HOMO of the material (the material having the lower energy level of the HOMO among the above two types of materials) of the first interlayer was lower than the energy level of the HOMO of the material (host material) of the red-light-emitting layer, and the difference between the energy levels was 0.2 eV. The energy level of the LUMO of the material (the material having the lower energy level of the LUMO among the above two types of materials) of the first interlayer was lower than the energy level of the LUMO of the material (host material) of the red-light-emitting layer, and the difference between the energy levels was 0.2 eV.

In addition, the energy level of the LUMO of the material (the material having the lower energy level of the LUMO among the above two types of materials) of the second interlayer was lower than the energy level of the LUMO of the material (host material) of the blue-light-emitting layer, and the difference between the energy levels was 0.1 eV. The energy level of the LUMO of the material (the material having the lower energy level of the LUMO among the above two types of materials) of the second interlayer was higher than the energy level of the LUMO of the material (host material) of the red-light-emitting layer, and the difference between the energy levels was 0.2 eV. The energy level of the HOMO of the material (the material having the lower energy level of the HOMO among the above two types of materials) of the second interlayer was higher than the energy level of the HOMO of the material (host material) of the red-light-emitting layer, and the difference between the energy levels was 0.2 eV.

Example 3

A light-emitting element was produced as in Example 1 except that the lamination order of the light-emitting layers, the material of the first interlayer, and the material of the second interlayer were different from those in Example 1. The first light-emitting layer was a red-light-emitting layer, the second light-emitting layer was a blue-light-emitting layer, and the third light-emitting layer was a green-light-emitting layer.

A mixture of the above-mentioned amine hole transport material (α-NPD) represented by Chemical Formula 1 and the above-mentioned acene bipolar material (ADN) represented by Chemical Formula 3 was used as the material of the first interlayer. The mixing ratio of the amine hole transport material and the acene bipolar material was (amine hole transport material):(acene bipolar material)=50:50. A mixture of a silole electron transport material (ET4 manufactured by Chisso Corporation) and the above-mentioned acene bipolar material (MADN) represented by Chemical Formula 5 was used as the material of the second interlayer. The mixing ratio of the silole electron transport material and the acene bipolar material was (silole electron transport material):(acene bipolar material)=50:50.

The energy level of the HOMO of the material (the material having the lower energy level of the HOMO among the above two types of materials) of the first interlayer was higher than the energy level of the HOMO of the material (host material) of the red-light-emitting layer, and the difference between the energy levels was 0.2 eV. The energy level of the HOMO of the material (the material having the lower energy level of the HOMO among the above two types of materials) of the first interlayer was lower than the energy level of the HOMO of the material (host material) of the blue-light-emitting layer, and the difference between the energy levels was 0.2 eV. The energy level of the LUMO of the material (the material having the lower energy level of the LUMO among the above two types of materials) of the first interlayer was lower than the energy level of the LUMO of the material (host material) of the blue-light-emitting layer, and the difference between the energy levels was 0.2 eV.

In addition, the energy level of the LUMO of the material (the material having the lower energy level of the LUMO among the above two types of materials) of the second interlayer was lower than the energy level of the LUMO of the material (host material) of the green-light-emitting layer, and the difference between the energy levels was 0.1 eV. The energy level of the LUMO of the material (the material having the lower energy level of the LUMO among the above two types of materials) of the second interlayer was higher than the energy level of the LUMO of the material (host material) of the blue-light-emitting layer, and the difference between the energy levels was 0.2 eV. The energy level of the HOMO of the material (the material having the lower energy level of the HOMO among the above two types of materials) of the second interlayer was higher than the energy level of the HOMO of the material (host material) of the blue-light-emitting layer, and the difference between the energy levels was 0.2 eV.

Example 4

A light-emitting element was produced as in Example 1 except that the structure of the first interlayer and the structure of the second interlayer were different from those in Example 1. More specifically, the light-emitting element shown in FIG. 3 was produced. The first interlayer had a laminated structure including a first layer provided at the green-light-emitting layer side and a second layer provided at the red-light-emitting layer side. The second interlayer had a laminated structure including a first layer provided at the red-light-emitting layer side and a second layer provided at the blue-light-emitting layer side.

In the first interlayer, the above-mentioned amine hole transport material (α-NPD) represented by Chemical Formula 1 was used as the material of the first layer, and the above-mentioned acene bipolar material (ADN) represented by Chemical Formula 3 was used as the material of the second layer. In the second interlayer, the above-mentioned acene bipolar material (MADN) represented by Chemical Formula 5 was used as the material of the first layer, and a silole electron transport material (ET4 manufactured by Chisso Corporation) was used as the material of the second layer.

The energy level of the HOMO of the material (the material having the lower energy level of the HOMO among the above two types of materials) of the first interlayer was higher than the energy level of the HOMO of the material (host material) of the green-light-emitting layer, and the difference between the energy levels was 0.2 eV. The energy level of the HOMO of the material (the material having the lower energy level of the HOMO among the above two types of materials) of the first interlayer was lower than the energy level of the HOMO of the material (host material) of the red-light-emitting layer, and the difference between the energy levels was 0.2 eV. The energy level of the LUMO of the material (the material having the lower energy level of the LUMO among the above two types of materials) of the first interlayer was lower than the energy level of the LUMO of the material (host material) of the red-light-emitting layer, and the difference between the energy levels was 0.2 eV.

In addition, the energy level of the LUMO of the material (the material having the lower energy level of the LUMO among the above two types of materials) of the second interlayer was lower than the energy level of the LUMO of the material (host material) of the blue-light-emitting layer, and the difference between the energy levels was 0.1 eV. The energy level of the LUMO of the material (the material having the lower energy level of the LUMO among the above two types of materials) of the second interlayer was higher than the energy level of the LUMO of the material (host material) of the red-light-emitting layer, and the difference between the energy levels was 0.2 eV. The energy level of the HOMO of the material (the material having the lower energy level of the HOMO among the above two types of materials) of the second interlayer was higher than the energy level of the HOMO of the material (host material) of the red-light-emitting layer, and the difference between the energy levels was 0.2 eV.

Comparative Example 1

A light-emitting element was produced as in Example 1 except that the interlayers were omitted.

Comparative Example 2

A light-emitting element was produced as in Example 1 except that the material constituting the second interlayer was different from that in Example 1.

The above-mentioned amine hole transport material (α-NPD) represented by Chemical Formula 1 was used as the material of the second interlayer. The energy level of the HOMO of the material of the first interlayer was higher than the energy level of the HOMO of the material (host material) of the green-light-emitting layer, and the difference between the energy levels was 0.1 eV. The energy level of the HOMO of the material of the first interlayer was lower than the energy level of the HOMO of the material (host material) of the red-light-emitting layer, and the difference between the energy levels was 0.1 eV. The energy level of the LUMO of the material of the first interlayer was lower than the energy level of the LUMO of the material (host material) of the red-light-emitting layer, and the difference between the energy levels was 0.1 eV.

In addition, the energy level of the LUMO of the material of the second interlayer was lower than the energy level of the LUMO of the material (host material) of the blue-light-emitting layer, and the difference between the energy levels was 0.1 eV. The energy level of the LUMO of the material of the second interlayer was higher than the energy level of the LUMO of the material (host material) of the red-light-emitting layer, and the difference between the energy levels was 0.1 eV. The energy level of the HOMO of the material of the second interlayer was higher than the energy level of the HOMO of the material (host material) of the red-light-emitting layer, and the difference between the energy levels was 0.1 eV.

2. Evaluations

2-1. Evaluation of Luminous Efficiency

The voltage (driving voltage) and the current efficiency were measured while supplying a constant current of 10 mA/cm$^2$ to each of the light-emitting elements of the Examples and Comparative Examples using a direct-current power supply. The voltage and the current efficiency were measured for five light-emitting elements in each of the Examples and Comparative Examples. The results are shown in Table 1.

TABLE 1

| | Chromaticity (CIE) | | | | Luminance lifetime | Luminous efficiency | |
| | | | | | | Current efficiency | Driving voltage |
| | at 1 mA/cm$^2$ | | at 50 mA/cm$^2$ | | at 100 mA/cm$^2$ | at 10 mA/cm$^2$ | at 10 mA/cm$^2$ |
| | x | y | x | y | [hr] | [cd/A] | [V] |
| Example 1 | 0.39 | 0.38 | 0.36 | 0.37 | 600 | 14.0 | 8.3 |
| Example 2 | 0.40 | 0.36 | 0.38 | 0.35 | 1,600 | 13.5 | 7.1 |
| Example 3 | 0.39 | 0.35 | 0.37 | 0.34 | 1,300 | 13.6 | 7.5 |
| Example 4 | 0.36 | 0.38 | 0.34 | 0.35 | 1,100 | 12.9 | 7.2 |
| Comparative Example 1 | 0.41 | 0.44 | 0.26 | 0.24 | 100 | 15.6 | 6.4 |
| Comparative Example 2 | 0.37 | 0.28 | 0.36 | 0.27 | 50 | 12.1 | 9.9 |

2-2. Evaluation of Luminance Lifetime

The luminance of each of the light-emitting elements of the Examples and Comparative Examples was measured with a luminance meter while continuously supplying a constant current of 100 mA/cm$^2$ to each of the light-emitting elements using a direct-current power supply. The time (LT80) taken for the luminance to decrease to 80% of the initial luminance was measured. The value of LT80 was measured for five light-emitting elements in each of the Examples and Comparative Examples. The results are shown in Table 1.

2-3. Evaluation of Chromaticity

The chromaticity (x, y) of color was determined with a chromaticity meter while supplying a constant current of 1 mA/cm$^2$ to each of the light-emitting elements of the Examples and Comparative Examples using a direct-current power supply. In addition, the chromaticity (x, y) of color was determined with a chromaticity meter while supplying a constant current of 50 mA/cm$^2$ to each of the light-emitting elements of the Examples and Comparative Examples using a direct-current power supply. As is apparent from Table 1, the light-emitting elements of the Examples had excellent chromaticity balance and durability while maintaining the luminous efficiency, as compared with the light-emitting elements of the Comparative Examples.

The entire disclosure of Japanese Patent Application No. 2008-018400, filed Jan. 29, 2008 is expressly incorporated by reference herein.

What is claimed is:

1. A light-emitting element comprising:
   a cathode;
   an anode;
   a first light-emitting layer that is disposed between the cathode and the anode and that emits light of a first color;
   a second light-emitting layer that is disposed between the first light-emitting layer and the cathode and that emits light of a second color different from the first color;
   a third light-emitting layer that is disposed between the second light-emitting layer and the cathode and that emits light of a third color different from the first color and the second color;
   a first interlayer that is disposed between the first light-emitting layer and the second light-emitting layer so as to be in contact with the first and second light-emitting layers and that has a function of preventing energy transfer of an exciton between the first light-emitting layer and the second light-emitting layer; and
   a second interlayer that is disposed between the second light-emitting layer and the third light-emitting layer so as to be in contact with the second and third light-emitting layers and that has a function of preventing energy transfer of an exciton between the second light-emitting layer and the third light-emitting layer,
   wherein the first interlayer has a hole-transporting property higher than that of the second interlayer,
   the second interlayer has an electron-transporting property higher than that of the first interlayer, and
   an energy level of a lowest unoccupied molecular orbital of a material constituting the first interlayer is lower than an energy level of a lowest unoccupied molecular orbital of a material constituting the second light-emitting layer.

2. The light-emitting element according to claim 1, wherein an energy level of a highest occupied molecular orbital of a material constituting the first interlayer is higher than an energy level of a highest occupied molecular orbital of a material constituting the first light-emitting layer.

3. The light-emitting element according to claim 2, wherein the energy level of the highest occupied molecular orbital of the material constituting the first interlayer lies between the energy level of the highest occupied molecular orbital of the material constituting the first light-emitting layer and an energy level of a highest occupied molecular orbital of a material constituting the second light-emitting layer.

4. The light-emitting element according to claim 3, wherein the difference between the energy level of the highest occupied molecular orbital of the material constituting the first interlayer and the energy level of the highest occupied molecular orbital of each of the materials constituting the first light-emitting layer and the second light-emitting layer is in the range of 0.1 to 0.4 eV.

5. The light-emitting element according to claim 1, wherein the energy level of the lowest unoccupied molecular orbital of the material constituting the first interlayer lies between an energy level of a lowest unoccupied molecular orbital of a material constituting the first light-emitting layer and the energy level of the lowest unoccupied molecular orbital of the material constituting the second light-emitting layer.

6. The light-emitting element according to claim 5, wherein the difference between the energy level of the lowest unoccupied molecular orbital of the material constituting the first interlayer and the energy level of the lowest unoccupied molecular orbital of each of the materials constituting the first light-emitting layer and the second light-emitting layer is in the range of 0.1 to 0.4 eV.

7. The light-emitting element according to claim 1, wherein an energy level of a highest occupied molecular orbital of a material constituting the second interlayer is higher than an energy level of a highest occupied molecular orbital of a material constituting the second light-emitting layer.

8. The light-emitting element according to claim 7, wherein the energy level of the highest occupied molecular orbital of the material constituting the second interlayer lies between the energy level of the highest occupied molecular orbital of the material constituting the second light-emitting layer and an energy level of a highest occupied molecular orbital of a material constituting the third light-emitting layer.

9. The light-emitting element according to claim 8, wherein the difference between the energy level of the highest occupied molecular orbital of the material constituting the second interlayer and the energy level of the highest occupied molecular orbital of each of the materials constituting the second light-emitting layer and the third light-emitting layer is in the range of 0.1 to 0.4 eV.

10. A light-emitting element comprising:
    a cathode;
    an anode;
    a first light-emitting layer that is disposed between the cathode and the anode and that emits light of a first color;
    a second light-emitting layer that is disposed between the first light-emitting layer and the cathode and that emits light of a second color different from the first color;
    a third light-emitting layer that is disposed between the second light-emitting layer and the cathode and that emits light of a third color different from the first color and the second color;
    a first interlayer that is disposed between the first light-emitting layer and the second light-emitting layer so as to be in contact with the first and second light-emitting layers and that has a function of preventing energy transfer of an exciton between the first light-emitting layer and the second light-emitting layer; and
    a second interlayer that is disposed between the second light-emitting layer and the third light-emitting layer so as to be in contact with the second and third light-emitting layers and that has a function of preventing energy transfer of an exciton between the second light-emitting layer and the third light-emitting layer,
    wherein the first interlayer has a hole-transporting property higher than that of the second interlayer, the second interlayer has an electron-transporting property higher than that of the first interlayer, and an energy level of a lowest unoccupied molecular orbital of a material constituting the second interlayer is lower than an energy level of a lowest unoccupied molecular orbital of a material constituting the third light-emitting layer.

11. The light-emitting element according to claim 10, wherein the energy level of the lowest unoccupied molecular orbital of the material constituting the second interlayer lies between an energy level of a lowest unoccupied molecular orbital of a material constituting the second light-emitting layer and the energy level of the lowest unoccupied molecular orbital of the material constituting the third light-emitting layer.

12. The light-emitting element according to claim 11, wherein the difference between the energy level of the lowest unoccupied molecular orbital of the material constituting the second interlayer and the energy level of the lowest unoccupied molecular orbital of each of the materials constituting the second light-emitting layer and the third light-emitting layer is in the range of 0.1 to 0.4 eV.

13. The light-emitting element according to claim 1, wherein the first interlayer contains an amine hole transport material.

14. The light-emitting element according to claim 1, wherein the second interlayer contains a silole electron transport material.

15. The light-emitting element according to claim 1, wherein at least one of the first interlayer and the second interlayer contains an acene bipolar material.

16. The light-emitting element according to claim 1, wherein the first interlayer includes a first layer disposed so as to be in contact with the first light-emitting layer and containing an amine hole transport material as a main material and a second layer disposed so as to be in contact with the second light-emitting layer and containing an acene bipolar material as a main material.

17. The light-emitting element according to claim 1, wherein the second interlayer includes a first layer disposed so as to be in contact with the second light-emitting layer and containing an acene bipolar material as a main material and a second layer disposed so as to be in contact with the third light-emitting layer and containing a silole electron transport material as a main material.

18. The light-emitting element according to claim 1, wherein the first light-emitting layer is a red-light-emitting layer that emits red light as the first color, the second light-emitting layer is a blue-light-emitting layer that emits blue light as the second color, and the third light-emitting layer is a green-light-emitting layer that emits green light as the third color.

19. The light-emitting element according to claim 1, wherein the first light-emitting layer is a green-light-emitting layer that emits green light as the first color, the second light-emitting layer is a red-light-emitting layer that emits red light as the second color, and the third light-emitting layer is a blue-light-emitting layer that emits blue light as the third color.

20. The light-emitting element according to claim 1, wherein each of the first interlayer and the second interlayer has an average thickness of 100 nm or less.

21. A display device comprising the light-emitting element according to claim 1.

22. An electronic apparatus comprising the display device according to claim 21.

* * * * *